United States Patent [19]

Chen et al.

[11] Patent Number: 5,141,602
[45] Date of Patent: Aug. 25, 1992

[54] HIGH-PRODUCTIVITY METHOD AND APPARATUS FOR MAKING CUSTOMIZED INTERCONNECTIONS

[75] Inventors: Chengjun J. Chen, Yorktown Heights; Richard I. Kaufman, Hartsdale, both of N.Y.; Julian P. Partridge, Austin, Tex.

[73] Assignee: International Business Machines Corporation, Armonk, N.Y.

[21] Appl. No.: 717,248

[22] Filed: Jun. 18, 1991

[51] Int. Cl.5 .................................................. C25D 5/02
[52] U.S. Cl. ................................. 205/103; 427/98; 427/96; 427/142; 205/115
[58] Field of Search .................. 204/16, 15; 427/98, 427/96, 142

[56] References Cited

U.S. PATENT DOCUMENTS

| | | | |
|---|---|---|---|
| 4,349,583 | 9/1982 | Kulynych et al. | 427/53.1 |
| 4,418,264 | 11/1983 | Thorwarth | 219/78.01 |
| 4,496,900 | 1/1985 | DiStephano | 324/51 |
| 4,615,904 | 10/1986 | Ehrlich et al. | 427/38 |
| 4,704,304 | 11/1987 | Amendola et al. | 427/57 |
| 4,919,971 | 4/1990 | Chen | 204/16 |
| 4,994,154 | 2/1991 | Chen et al. | 204/16 |

*Primary Examiner*—John Niebling
*Assistant Examiner*—Kishor Mayekar
*Attorney, Agent, or Firm*—Robert M. Trepp

[57] ABSTRACT

An apparatus and method for plating metal on a conductor and/or across gaps on insulating substrates is described incorporating two probes, a probe positioner, first circuitry for applying alternating-current electrical power wherein the magnitude of the voltage is controlled as a function of time, and second circuitry for applying alternating-current electrical power wherein the magnitude of the current is controlled as a function of time. The invention overcomes the problem of providing an automatic apparatus for reliably repairing defective wiring or completing seeded sections of wiring having a wide range of initial thermal and electrical characteristics.

40 Claims, 15 Drawing Sheets

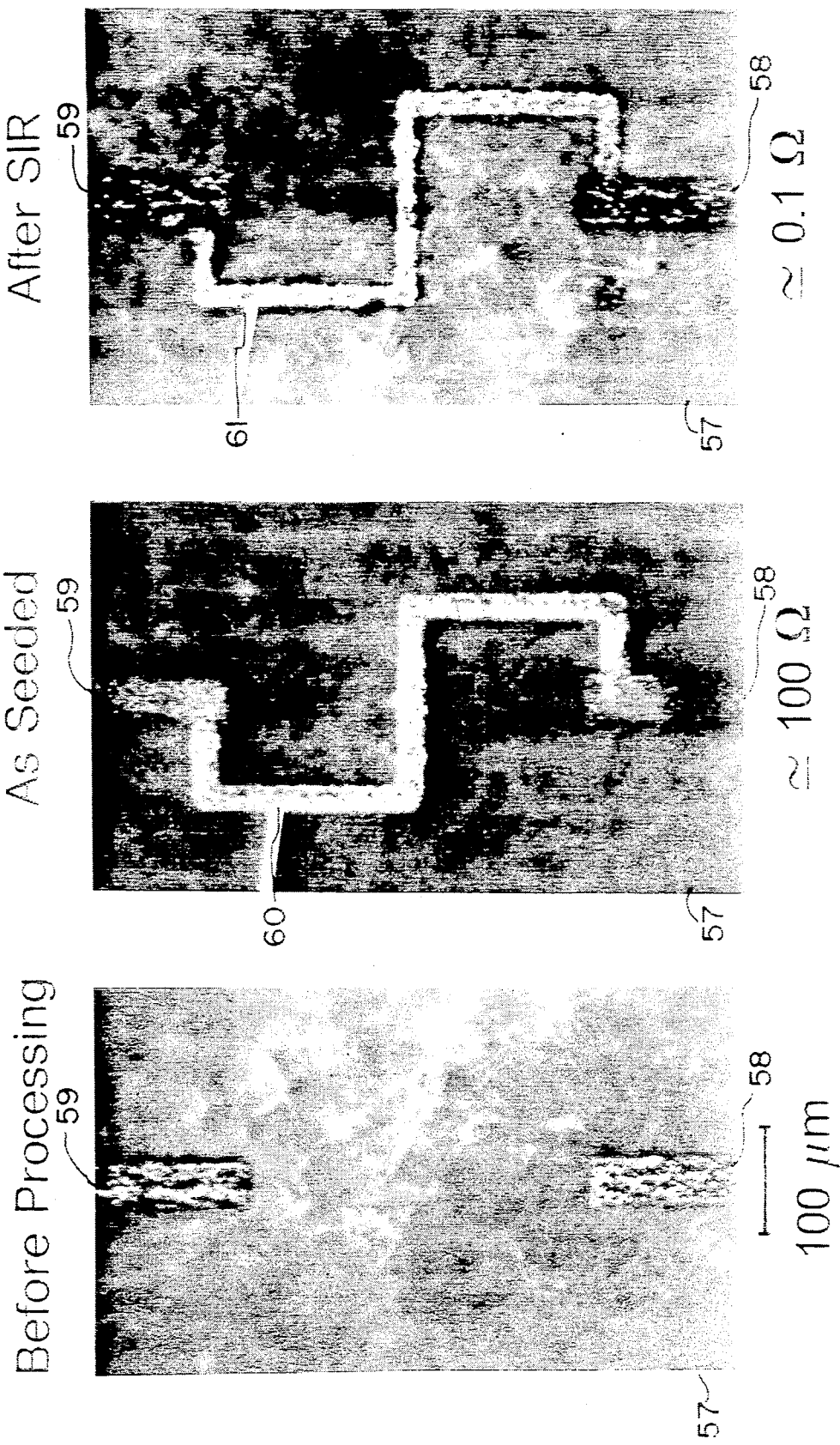

FIG. 6C ≃ 0.01 Ω AFTER SIR
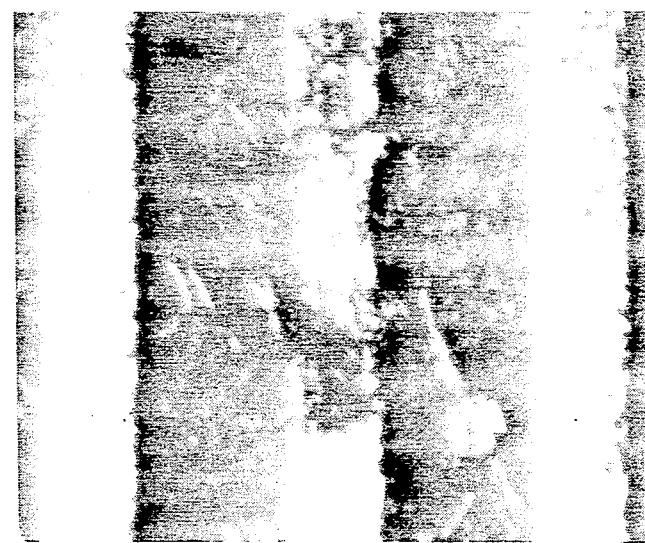
FIG. 6B ≃ 10 Ω AS SEEDED
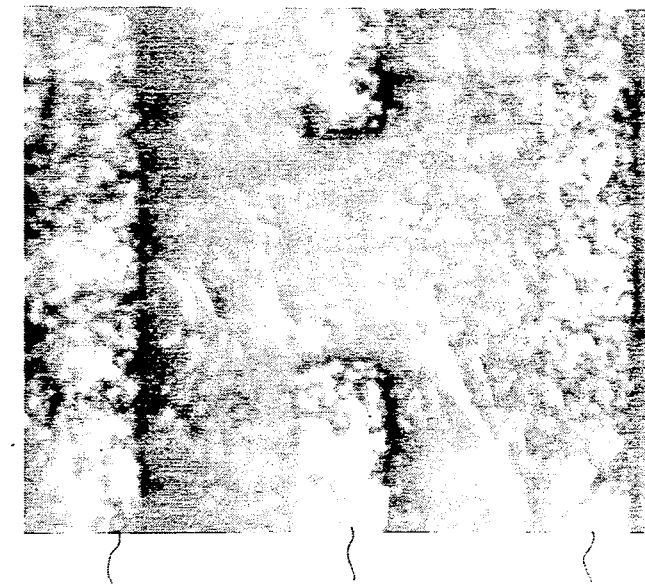
FIG. 6A BEFORE REPAIR
100 μm

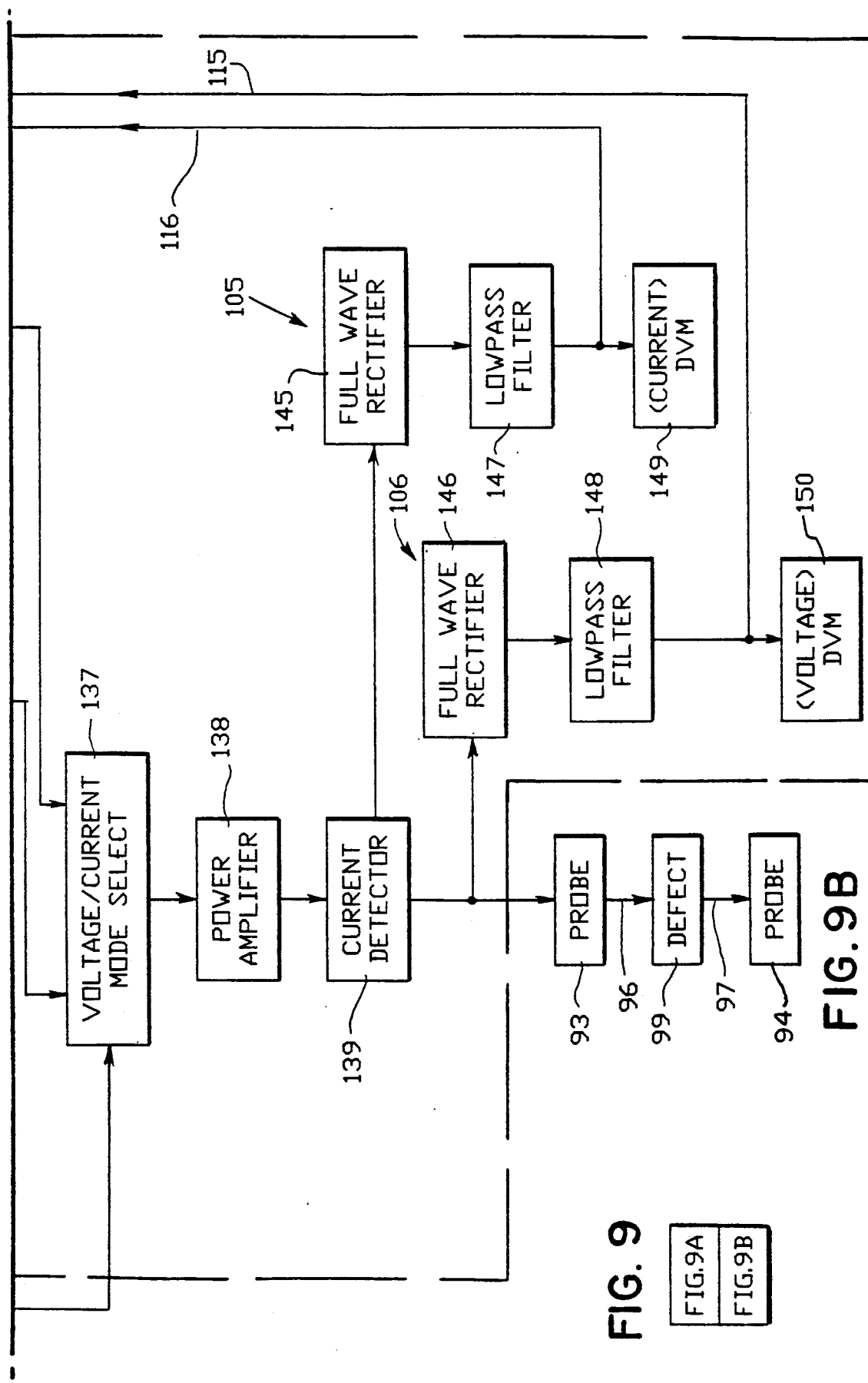

HIGH-PRODUCTIVITY METHOD AND APPARATUS FOR MAKING CUSTOMIZED INTERCONNECTIONS

BACKGROUND OF THE INVENTION

1. Field of the Invention

This invention relates to a process and equipment for making patterned metal structures on insulating substrates, and more particularly to forming desired electrical interconnections on printed circuit boards and substrates for interconnecting microelectronic circuits. It comprises a voltage ramping process followed by a current ramping process of alternating current electrical power into a partially formed metal structure immersed in a plating solution, to provide local Joule heating at the weak links in the metal structure, thus to induce local electrolytic plating or local electroless plating onto the weak links.

2. Description of the Prior Art

In addition to the lithographic method (parallel process), the customized wiring process (serial process) is an important manufacturing step in the microelectronics industry. First, almost in any practical case of complicated microelectronics system, customized interconnections have to be made after the lithography step, which is called engineering changes (EC). Second, the printed circuit boards and modules manufactured from lithography often have defects. The circuit opens are the most common one. Traditionally, the circuit opens are repaired by ribbon brazing. As the dimensions of microelectronic units becomes smaller and smaller, the ribbon brazing method becomes impractical. The EC's often have complicated geometry and the ribbon brazing method cannot be applied. Laser chemical vapor deposition (LCVD) has been considered as a leading technology for making open repair and EC's. LCVD has been described in U.S. Pat. No. 4,340,617 which issued on Jul. 20, 1982 to Deutsch et al. entitled "Method and Apparatus for Depositing a Material on a Surface" and in U.S. Pat. No. 4,615,904 which issued on Oct. 7, 1986 to Ehrlich et al. entitled "Maskless Growth of Patterned Films." However, there are several problems with the LCVD method: the resistivity of LCVD deposited metal is usually much higher than the bulk due to the porous structure and inclusion of organic materials; the contact resistance between the original line and the LCVD deposition is often too high; the deposition process requires a good vacuum, but the outgassing of the substrate can take up to several hours; and finally, for large circuit boards, the atmospheric pressure on the optical window of the vacuum chamber can be as high as a few metric tons, a severe structural and optical problem for the apparatus.

In a publication by M. E. Gross et al., entitled "Laser Direct-Write Metallization in Thin Palladium Acetate Films", J. Appl. Phys. 61, 1628 (1987), a system for deposition of palladium from a single component metal-organic film or palladium acetate which was spin coated from a chloroform solution was described. Decomposition of the film was induced by a focused 20 watt cw argon laser wherein the film coating was 0.1 to 1.5 μm thick. However, the resistance of the palladium interconnection thus generated, usually between a few ohms and a few kilohms, is too high to be useful in microelectronics circuits.

A novel method for repairing circuit defects has been described in U.S. Pat. No. 4,919,971 which issued on Apr. 24, 1990 to C. J. Chen entitled "Self-Induced Repairing of Conductor Lines" and assigned to the assignee herein. For treating a circuit line with a near open (constriction), the printed circuit board is immersed in a plating solution. An ac current is passed through the defective line. Because the defect (near open, constriction) has a higher electrical resistance and a higher thermal resistance, it becomes hotter than the normal parts of the line. Either by the thermobattery effect (in electrolytic plating solution) or by the temperature dependence of plating rate (in the electroless plating solution), the defect is plated up preferentially. The patent recites that an alternating current is preferred but that the frequency and the wave shpae are probably not critical. Further, the most convenient source to use is described as a 60 hertz commercial power line with the voltage reduced to a few volts. The patent describes the process as starting with a low AC current, for example, 1 ampere, and slowly ramping the current up with a speed of 1-2 amperes/minute until it reached 4 amperes to 4.5 amperes which was the maximum tolerable current for this conductor line. The current was maintained at 4 to 4.5 amperes for about 2-3 minutes and then terminated.

A description of a two step method for repair of "opens" in an electronic circuit is found in U.S. Pat. No. 4,994,154 which issued Feb. 19, 1991 to C. J. Chen and R. J. von Gutfeld entitled "High Frequency Electrochemical Repair of Open Circuits" and assigned to the Assignee herein. In the first repair step, the electronic material is partially covered or immersed in a plating solution and a high frequency current is passed through the open ends of the circuit with the plating solution enabling the current to complete the path. The resulting Joule losses produces heat directly proportional to the resistance of the current path, resulting in metal deposition of a few microns in width across the circuit break. The second step consists of passing alternating current through the relatively high resistant defect in a high speed plating solution. The alternating current may be low frequency of about 50 hertz or greater. The frequency of alternating current during the first step can range from about 0.04 kHz TO 5,000 kHz in contact, either submerged or covered by one or several droplets, with an unacidified neutral metal ion solution which results in a rapid growth of the metal in the gap, the open circuit. During the first step, metal deposition in the form of dendrite growth occurs at a linear rate of up to 2-5 μm/s with a current (voltage) being ramped from 0 to several milliamps over the time span of the repair. Slow current ramping is normally undertaken to initiate controlled growth of the metal typically copper. The patent further describes metal probes preferably made of copper or copper alloys placed in contact with the pads or ends of a defective line. A resistor and high frequency current source constitute the electrical circuit which is used to provide alternating current.

The self-induced repair process of U.S. Pat. No. 4,919,971 can also be used for repairing true opens in conductors and for producing customized interconnections. By making an initial connection to the circuit open with a conducting film (for example, laser direct writing using an organometallic film, the situation becomes similar to a near-open. The self induced repair process then restores a near-open to a uniform metal line.

However, by directly using the self-induced repair process described in U.S. Pat. No. 4,919,971, the success rate has been low. Experiments have shown that the resistance of the seeded trace generated by laser solid-film process spreads over a wide range, from a few ohms to tens of kilohms. Using the current ramping method disclosed in U.S. Pat. No. 4,919,971, the seeded metal (e.g., palladium) trace often breaks because of excess heat.

For a process to be used as a manufacturing method, it should be very reliable, and the yield should be close to 100%. Also, the process should be ready to be automated to reduce labor cost. The present invention is an improvement of the SIR process described in U.S. Pat. No. 4,919,971. The new method can reproducibly generate high-quality interconnections with high efficiency and by nature an automated method, thus providing for high productivity.

The new control process has a number of control parameters. Those parameters depend only on the materials and the dimensions of the batch of the product, but independent to the dimension, length, width, thickness, material, and resistance of individual interconnection. Once a set of parameters for a batch of product is properly chosen, a 100% success rate is demonstrated. Moreover, by using this new method, the process time can be shortened to minimum, and the entire process can be easily made automatic, thus to reduce manufacturing cost. This process works as long as the seeded trace has a finite resistance (e.g., from a few ohms to tens of kilohms). The low requirement of the initial laser seeding makes possible the choice of a simple and inexpensive seeding step, and allows a very wide process window.

SUMMARY OF THE INVENTION

In accordance with the present invention, an apparatus is provided for plating metal on a conductor in a first region having high electrical resistance for example, a defect in wiring having a crack, a narrow line width, a thinned conductor, or a seeded section, for example a thin palladium film, positioned between second and third regions on the conductor having low electrical resistance comprising a spray nozzle, liquid dispenser, or bath for introducing an electrolyte suitable for a subsequent metal plating process over and in electrical contact with the first, second and third regions, for example, a defect in a metal wire or a seeded section and its adjacent conductor areas of for example copper, first and second probes, a mechanical positioner for positioning the first and second probes in electrical contact with the second and third regions, i.e. on either side of the defect or seeded section, a source of alternating current electric power which during a first period applies power through the first and second probes to the first region wherein the magnitude of the voltage across the first and second probes is controlled according to a predetermined function of time, and a source of alternating current electric power which is applied during a second time period after the first time period through the first and second probes to the first region wherein the magnitude of the current passing through the first and second probes is controlled according to a predetermined function of time.

This invention provides a three-stage process for executing the SIR step following the formation of the seeded trace by laser solid-film process (e.g. palladium trace from palladium acetate). It is based on the theory of threshold voltage described in the above mentioned article by C. J. Chen, J. Electrochem. Soc. 138, 969 (1991). This process needs an accurate control with a feed-back signal, which is very difficult to operate manually. Therefore, to execute this process, an automated system is needed.

The invention further provides an apparatus for repairing a partially defective conductor having an electrolyte liquid suitable for a subsequent metal plating process positioned thereover wherein said partially defective conductor includes a first region of reduced cross-section of high electrical resistance and second and third regions on either side of the first region of low electrical resistance comprising first and second probes, a positioner for positioning first and second probes in electrical contact with the second and third regions, respectively, a source of electric power for applying alternating current electric power during a first time period through the first and second probes to the first region wherein the magnitude of the voltage across the first and second probes is controlled according to a predetermined function of time, and a source of electric power for applying alternating current electric power during a second time period after the first time period through the first and second probes to the first region wherein the magnitude of the current passing through the first and second probes is controlled according to a predetermined function of time.

It is an object of the invention to prevent the side effects, such as bubbling and dendrite growth that, often occur during processing which is described in a publication by C. J. Chen, entitled "Constriction-Induced Local Electrodeposition: The Principle of Self-Induced Repair", J. Electrochem. Soc. 138, 969 (1991).

It is an object of the invention to provide an automatic apparatus for repairing defective wiring or completing the seeded section utilizing Joule heating of the selected area followed by inducing local electrolytic plating or local electroless plating on the thin seeded section or the defect.

It is an object of the invention to control the electric waveforms during the Joule heating process as a function of the voltage during a first time period and as a function of the current during a second time period.

It is an object of the invention to provide an alternating current electric power source having alternating current waveforms having a frequency for optimizing Joule heating of selected areas on a conductor for inducing local electrolytic plating or local electroless plating.

It is an object of the invention to provide a selected waveform of alternating current to induce the plating of metal and at the same time to monitor the alternating current for feedback and control of the waveform and for termination of the plating process.

BRIEF DESCRIPTION OF THE DRAWINGS

FIGS. 5A-5C show a typical customized interconnection made by the process and apparatus of the present invention.

FIGS. 6A-6C show a customized interconnection sequence for an open repair in which the line spacing is very small showing the absence of a proximity effect in this dimension.

FIGS. 9A and 9B are the preferred embodiment of the electronic control unit.

DESCRIPTION OF THE PREFERRED EMBODIMENT

Figure 1A:
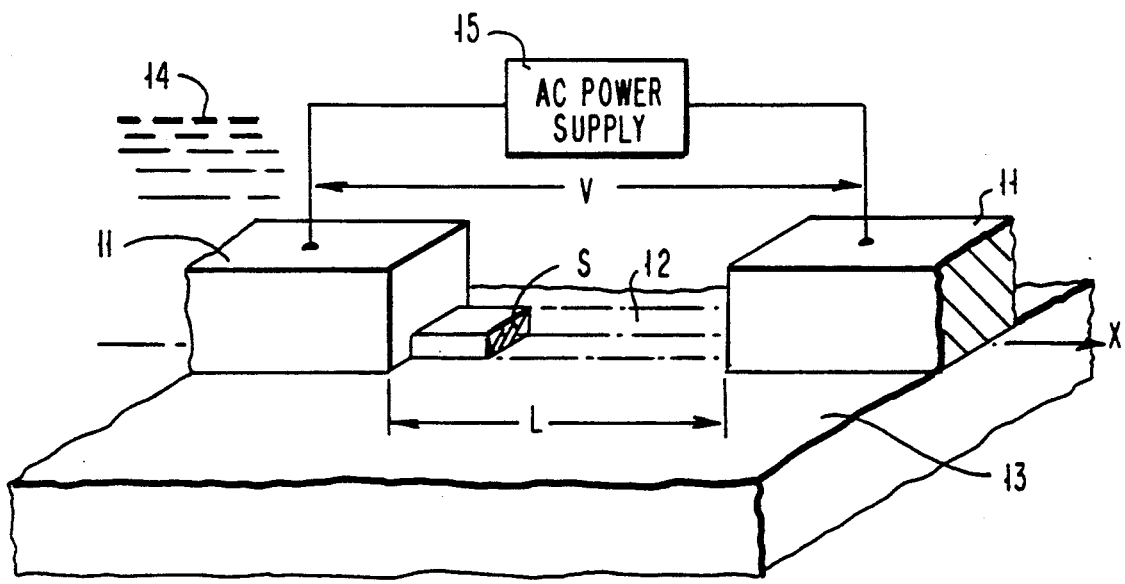
FIG. 1A is a schematic diagram of a constriction with an ac current passing through showing the concept of threshold voltage.
Figure 1B:
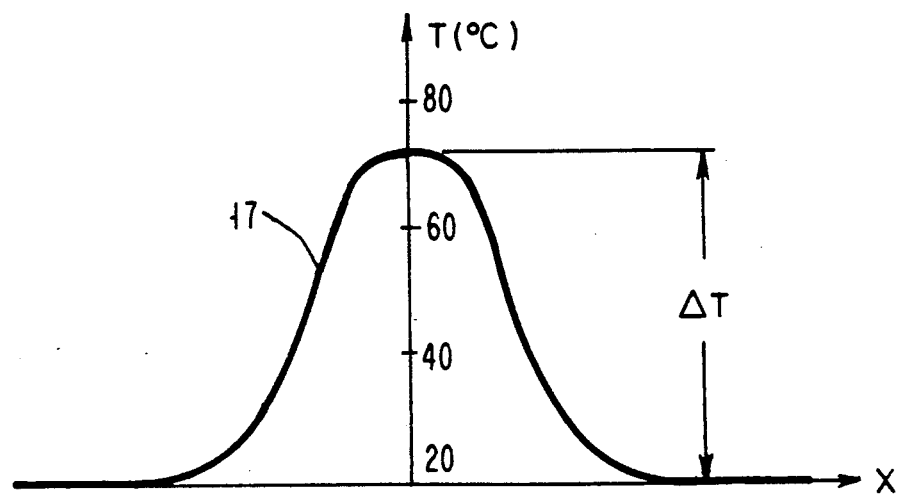
FIG. 1B is a graph of the temperature rise as a function of distance x along the constriction shown in FIG. 1A.

FIG. 1A shows a typical constriction 12 in a conductor 11. An ac current is passed from AC power supply 15 through conductor 11. Because the electrical conductivity and the thermal conductivity of conductor 11 and constriction 12 (e.g., copper) are much higher than those of the substrate 13 and plating solution 14, in the first approximation, the current and the heat flow are considered to be confined in conductor 11 and constriction 12 only. The Joule heat W generated by the current is $$W = \frac{I^2}{R} = \frac{\sigma S I^2}{L}. \tag{1}$$

where $\sigma$ is the electrical conductivity, S is the cross section, and L is the length of constriction 12. At equilibrium, the Joule heat has to be conducted through the conductor 11 and constriction 12. This requires a temperature gradient in constriction 12. At the center of the constriction 12, the temperature is higher than the environment temperature by an amount $\Delta T$ as shown by curve 17 in FIG. 1B. In FIG. 1B the ordinate represents temperature in degrees Celsius and the abscissa represents distance x along conductor 11 and constriction 12. It follows that Joule heat W $$W \propto \frac{\kappa S \Delta T}{L}. \tag{2}$$

where k is the thermal conductivity of the metal. By equating the Joule heat, Eq. (1), and the heat flow, Eq. (2), the temperature rise $\Delta T$ is $$\Delta T \propto \frac{\sigma}{\kappa} I^2. \tag{3}$$

The ratio of the electrical conductivity and the thermal conductivity is a universal quantity independent of the metal (Wiedermann-Franz's law). Therefore, the maximum temperature rise $\Delta T$ at constriction 12, in this approximation, only depends on the applied voltage. A detailed theoretical analysis of the temperature distribution of an arbitrary constriction using a one-dimensional heat-flow model, described in C. J. Chen, J. Electrochem. Soc. 138,969 (1991) which is incorporated herein by reference, reveals that the maximum temperature rise $\Delta T$ at the defect is independent of the resistance and shape of the defect and the material of the metal, but only depends the voltage V applied on the defect:

$$\Delta T = \frac{3}{8\pi^2 T} \left(\frac{e}{k_B}\right)^2 V^2. \tag{4}$$

where $k_B$ is Boltzmann's constant, e is the elementary change, and T is the room temperature in Kelvin (about 300 K). As seen the temperature rise is determined only by the voltage applied on the constriction, independent of its shape, resistance, and material.

To make an estimation of the voltage required for a temperature rise of 60 K, which is the condition to induce a substantial metal deposition, it is found from Eq. 1 that $$V = 5.13 \frac{k_B T}{e} \sqrt{\frac{\Delta T}{T}} = 60 \text{ mV}. \tag{5}$$

The voltage from equation 5 of 60 mv is actually the lower limit. Because of the finite thermal conductivity of plating solution 14 and substrate 13, the voltage needed for generating a 60 K temperature rise is greater than 60 mV. Furthermore, if the finite resistance of the good portions of the line, conductor 11, is taken into account, the voltage required to apply on the ends of the line, conductor 11, should be even larger. Nevertheless, the value given in Eq. (5) is useful since it is the absolute minimum voltage which is needed in all practical conditions to induce an appreciable effect. The voltage V from equation 5 is called the threshold voltage.

There are two immediate consequences of the existence of a threshold voltage

When the voltage applied across constriction 12 is less than the theoretical threshold voltage determined by equation 5, the heating at the defect or constriction 12 is not enough to cause any appreciable effect i.e. plating of metal on on constriction 12. Therefore, it is always safe to start with applying a voltage across constriction 12, which is less than the threshold voltage defined by equation 5.

At a temperature right above the threshold voltage, the electrodeposition process starts. There should be a dramatic increase of current (or a dramatic decrease of the resistance of the defect or constriction 12) at that voltage. Actually, at the threshold voltage, as the defect is being repaired, the maximum temperature remains the same, and the plating continues automatically. The plating slows down when the resistance of the defect becomes much smaller than the resistance of the good sections of the entire line i.e. conductor 11, such that the voltage on the defect or constriction 12 is much smaller than the voltage applied on the entire line or conductor 11 across constriction 12.

Experimentally, the threshold voltage is found to be 120~180 mV.

A three-stage SIR process is established upon the general theory of SIR, especially the theory of threshold voltage, as described by equations 1-5. The method has been well verified experimentally.

After a printed circuit board or substrate 13 is immersed in plating solution 14, a three-stage process may be executed.

In the voltage-ramping stage, the electronics functions as a programmed constant-voltage power supply during a first time period.

When the process starts, an ac voltage which is less than the actual threshold voltage is applied to conductor 11 across the defect or constriction 12. It is called the starting voltage. At the starting voltage, there is no plating action. Typically, the starting voltage is about 150 mV.

Then, the ac voltage is ramped at a predetermined rate to reach the threshold voltage. This rate is called the voltage ramping rate. The typical voltage ramping rate, as obtained from a large number of examples or runs, is 2-10 mV/sec. If the voltage ramping rate is set to high, side effects will occur, or the seeded section or constriction 12 breaks. A very low voltage ramping rate will cause a long processing time, thus an increase of manufacturing cost.

During the voltage ramping stage, the current through conductor 11 and constriction 12 is constantly measured and monitored. The resistance, which is the ratio of applied voltage to the measured current, is also monitored. Although the resistance of constriction 12, measured in air, is typically a few ohms to a few kilohms (basically it is the resistance of the seeded section or constriction 12), when the board or substrate 13 is immersed in plating solution 14, the line resistance drops to between a few ohms to tens of ohms. This is because the liquid is electrically conducting. At the first few seconds, the resistance is a constant. At a certain applied voltage across constriction 12, the resistance drops due to build-up of plated metal. Sometimes, the dropping in resistance is dramatically fast. To avoid overheating constriction 12, if the current is increasing too fast, the voltage ramping is temporarily suspended and the voltage is held constant. The resistance of the entire line or conductor 11 including constriction 12 is reduced to the normal or typical resistance value of a good line, typically around one ohm. The entire voltage-ramping stage during a first time period typically takes one to two minutes.

Although at this point, the resistance of the entire line becomes normal, the seeded section is still too weak. By applying a high current to the line, it often breaks. Therefore, the process must continue. On the other hand, since the resistance of the defect becomes much less than the resistance of the entire line, and the resistance of the entire line varies from line to line (because of the difference of line length), the voltage is no longer a good control parameter. After the first stage is finished, the current becomes the right control parameter for further plating due to the temperature of the defective conductor.

In this stage, the electronics hardward functions as a programmed constant current source. The ac current is ramped from a predetermined value up to a maximum value.

The switching from the voltage-ramping stage to the current-ramping stage is triggered by the current reading when it reaches a predetermined crossover current. The actual value of such a crossover current varies with the dimension of the conducting line. For small lines (e.g., 25 micrometers in width, 10 micrometers in height), 100 mA is appropriate. For wide lines (e.g., 150 micrometers in width, 25 micrometers in height), 300 mA is appropriate.

After switching over to the current-ramping stage, the current is increased at a predetermined rate, referred to as the current ramping rate. A typical value of the current ramping rate is in the range from 5 mA/sec to 30 mA/sec depending on the line dimension. The ramping continues until it reaches a predetermined value, the maximum current.

The maximum current is the current the line can tolerate for a relatively long time, e.g., a few minutes. When the current reaches the maximum current, the conducting line is electrically sound. However, to make it more durable, the ac current is kept at a predetermined maximum current for a few minutes. The local plating at the defect or constriction 12 is still going on. As the cross section of the seeded section becomes comparable to the cross section of the normal sections of the line, it is no longer much warmer than the rest of the line. Therefore, the self-induced electrodeposition process terminates automatically. The time to stay at the maximum current is referred to as the overdrive time. Typically, it is in the range from 50 seconds to 200 seconds.

The parameters can be determined by actual testing, which is described later.

Two examples are described herein of the SIR process on a palladium seeded trace on a substrate. The plating solution contains 1M $CuSO_4$ and 0.25M $H_2SO_4$. The width of the line is 50 micrometers, and the height is 10 micrometers. The gap length is 100 micrometers, which is much smaller than the total length of the line, 30 mm. For the first example, the seeded trace has a low resistance (about 3 ohms) in air. For the second example, the seeded trace has a very high resistance (100 kilohm) in air. The parameters are the same for both examples: starting voltage, 150 mV; voltage ramping rate, 2 mV/sec; crossover current, 200 mA; current ramping rate, 4 mA/sec; maximum current, 500 mA; overdrive time, 120 sec.

Figure 2:
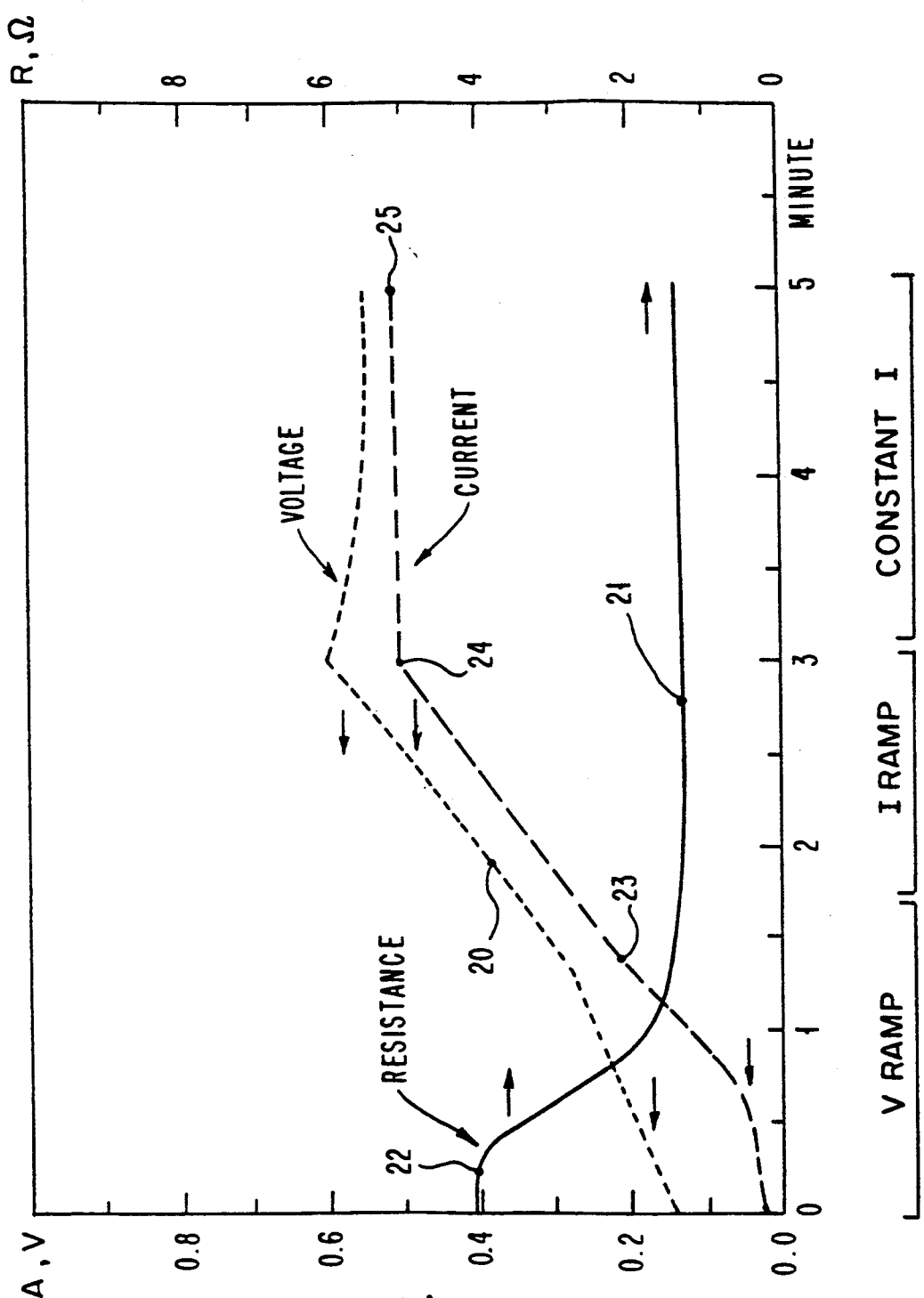
FIG. 2 is a normal record of the evolution of the line resistance during the self-induced repair (SIR) step.

FIG. 2 shows a "normal" record consisting of curves 19-21 where the resistance of the seeded section is less than 10 ohms in air. The starting current as shown by curve 19 is about 50 mA. The starting resistance as shown by curve 21 at time zero is about 4.1 ohms in the plating solution. After about 20 seconds, the resistance starts to drop as shown by point 22 on curve 21. It drops to 1.2 ohm in about one minute. When the current reaches the preset crossover value, in this case 200 mA, the electronics is switched to current ramping as shown by point 23 on curve 19. After the current reaches the preset maximum value, in this case 500 mA as shown by point 24 on curve 19, the maximum current continues to be applied for a preset time, in this case two more minutes, and then stopped as shown by point 25 on curve 19. In the current ramping stage and the constant current stage, the resistance decreases slowly. This does not mean that there is very little effect. Actually, from the microscope, it is observed that the plating on the seeded section grows rapidly. Because the length of the seeded section (100 micrometer) is much smaller than the length of the entire line, the resistance change of the seeded section is hardly detectable from the measurement of the total resistance of the line.

Figure 3:
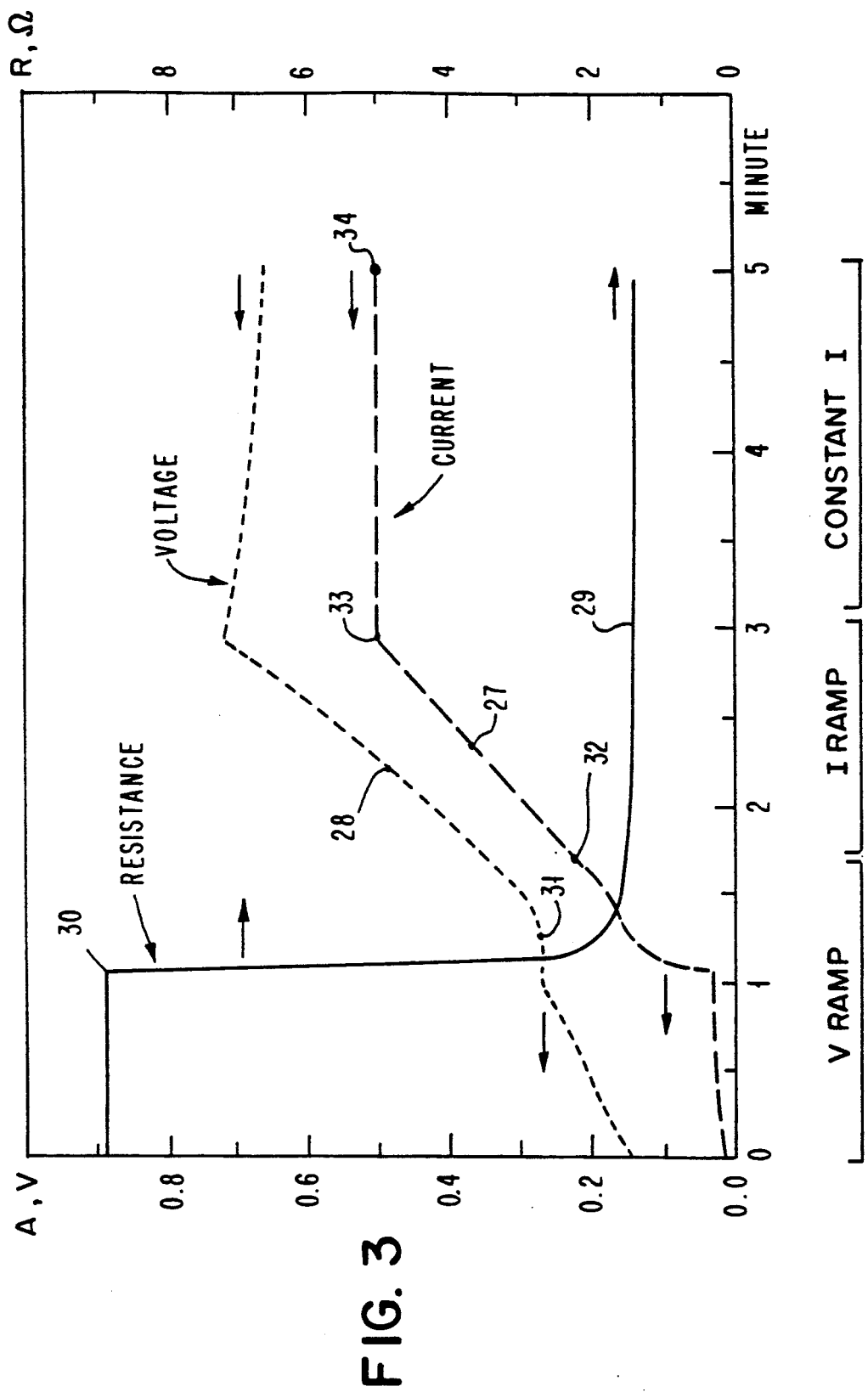
FIG. 3 is another type of the record of the evolution of the line resistance during the SIR step, where the initial resistance is very high.

FIG. 3 shows a record consisting of curves 27-29 where the initial resistance of the seeded section, when measured in air, is very high (above 1 kilohm). The starting resistance observed in plating solution is about 9 ohms as shown by curve 29, which is much smaller than the resistance of the line measured in air, about 100 kilohm. This is because the line resistance measured in air is largely the contact resistance between the good metal (copper) line and the seeded palladium section. As the board is immersed in the plating solution, the conductive solution bridges the contact resistance. It takes more than one minute to observe an action, where the resistance drops abruptly to about 2 ohms in a few seconds as shown by point 30 on curve 29. It can be interpreted as the growing copper suddenly completes the circuit. The dramatic action at this time was observed by the microscope as a sudden change of the color of the seeded section from gray (palladium) to yellow (copper). The large current rise gives a signal to the voltage output unit to temporarily suspend the voltage ramping, until the rising current rate becomes low as shown by point 31 on curve 28. When the current reaches the preset crossover value, in this case 200 mA, the electronics is switched to current ramping as shown by point 32 on curve 27. After the current reaches the preset maximum value, in this case 500 mA as shown by point 33 on curve 27, the maximum current continues to be applied for a preset time, in this case two more minutes, and then stopped as shown by point 34 on curve 27. In the current ramping stage and the constant current stage, the resistance decreases slowly. The resistance change of the seeded section is hardly detectable from the measurement of the total resistance of the line.

FIGS. 4A through 4E represent a preferred embodiment of the two-step process for making customized interconnections.

Figure 4A:
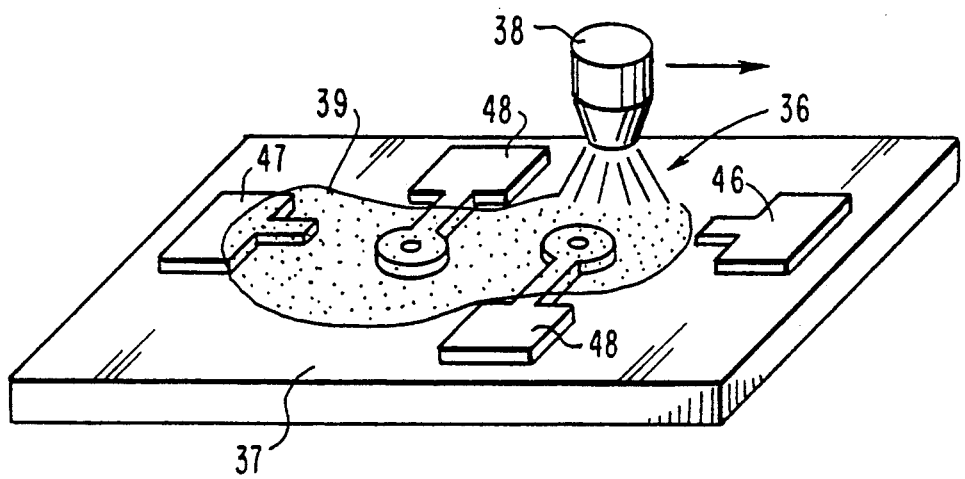
FIGS. 4A-4E show a preferred embodiment of the two-step process for customized wiring.

A first step as shown in FIG. 4A is: Applying or spraying a solution 36 of an organometallic compound on the substrate 37 to cover the areas of desired wiring. Examples of solutions 36 are: copper formate in water, silver neo-decanoate in xylene, and palladium acetate (PdAc) in chloroform. One proven recipe for solution 36 is to dissolve 1 gram of PdAc in the mixture of 8 ml chloroform and 2 ml of methol alcohol, and spray this solution with a nozzle 38 onto substrate 37. Solution 36 dries quickly to form a shiny brown film 39. The spraying process is preferred (versus spinning) because it reduces the cost of material, and simplifies cleaning procedure.

Figure 4B:
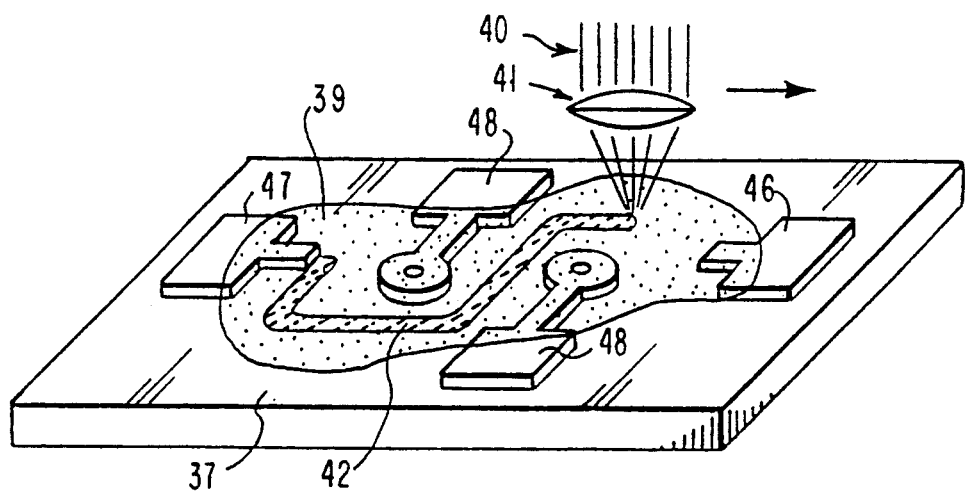

A second step as shown in FIG. 4B is: Using a focused laser to provide laser light 40 directed through lens 41 to decompose the organometallic compound 39 locally to generate a conducting trace 42 along the desired path. Although many kinds of lasers can be used, the preferred embodiment is a 100–500 mW air-cooled argon ion laser operated at 514.5 and/or 488 nm. Typically, the power at the substrate surface is 20–50 mW.

Figure 4C:
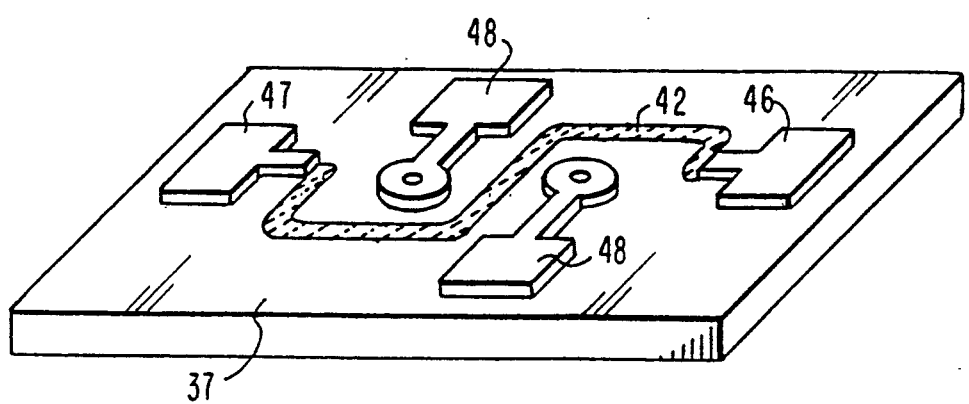

A third step as shown in FIG. 4C is: Rinsing off the unreacted organometallic film 39 on substrate 37. A conducting trace 42 along the desired path is left on substrate 37.

Figure 4D:
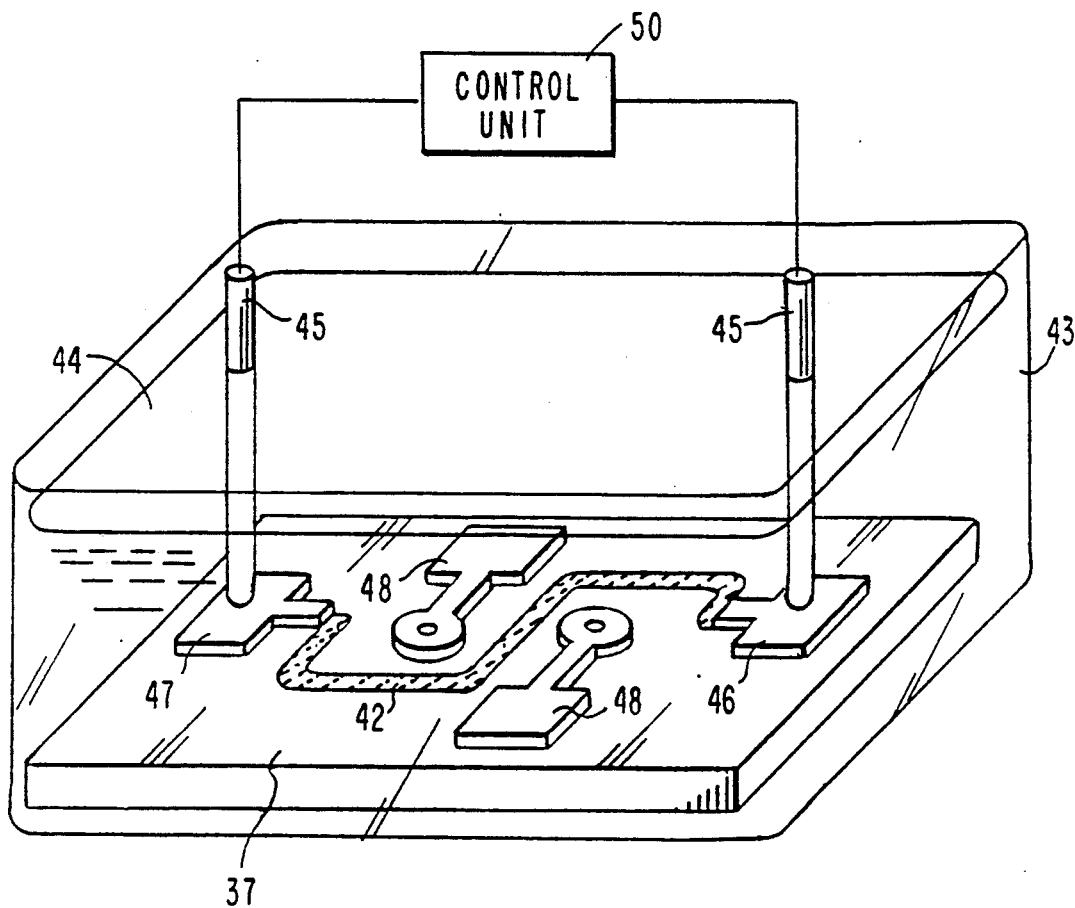

A fourth step as shown in FIG. 4D is: Execute the SIR step as described above. Substrate 37 is placed in a liquid container or tray 43 with a plating solution 44 therein to immerse the conducting trace 42. Although various kinds of plating solutions are available, a proven recipe is the aqueous solution with 1M $CuSO_4$ and 0.25M $H_2SO_4$.

Probes 45 which may be for example solid copper or other metal covered with copper are positioned on parts 46 and 47 of the existing circuit to be connected. Other structures 48 on substrate 37 are unaffected by the SIR plating process. Probes 45 are connected to a control unit 50 for applying alternating current electrical power as described herein.

Figure 4E:
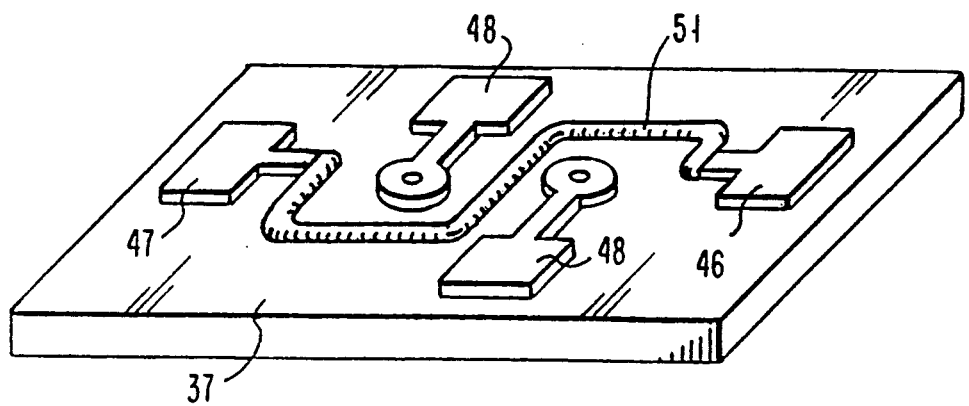

A fifth step as shown in FIG. 4E is: Rinse off the remaining plating solution 44 with water. A copper trace 51 is formed.

FIGS. 5A through 5C show a sequence of making an arbitrary copper wire on a substrate 57. In FIG. 5A, the two copper lines 58 and 59 on a substrate 57 are to be connected. The width of the original copper line is 50 micrometers. FIG. 5B shows substrate 57 after palladium seeding. The resistance of the seeded trace 60 is about 100 ohms. FIG. 5C, shows substrate 57 after the SIR step described herein. The resistance of the final copper trace 61 is about 0.1 ohm. The width of the formed copper line is 25 micrometers.

FIGS. 6A through 6C show a sequence of repairing a circuit open on a circuit board 62 with very small line spacing. The width of the copper lines 63–65 is 50 $\mu$m, and the spacing is 75 $\mu$m. In FIG. 6A, the center line 64 has a open of 100 $\mu$m in length. FIG. 6B shows board 62 after seeding with palladium. The resistance is about 10 ohms.

FIG. 6C shows board 62 after SIR. The resistance of the copper connection, line 64, is about 0.01 ohm. There is no effect on the neighboring lines 63 and 65 during the entire process.

Figure 7A:
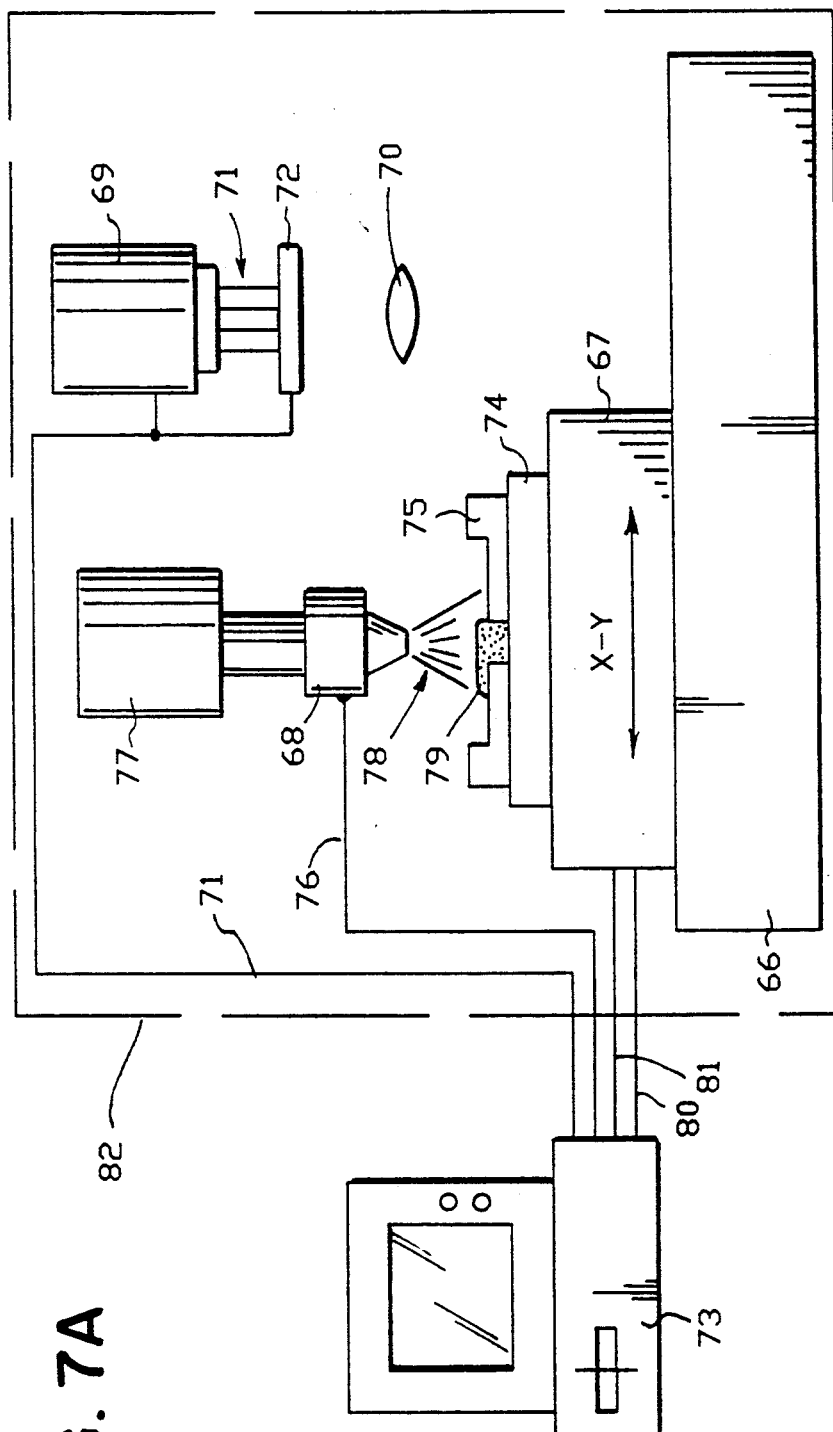
FIGS. 7A and 7B show two positions of the preferred embodiment of the laser seeding apparatus.
Figure 7B:
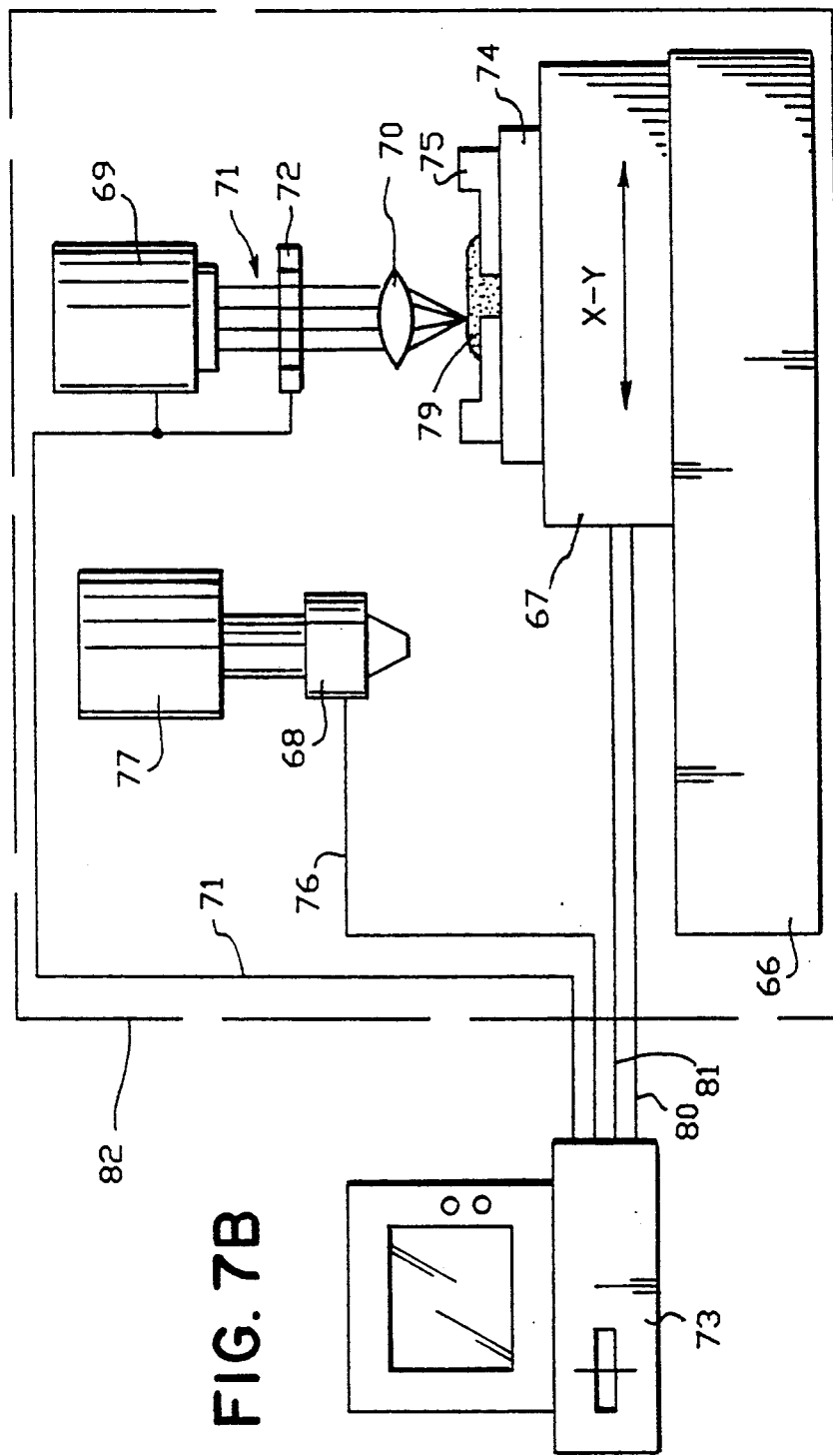
Figure 8:
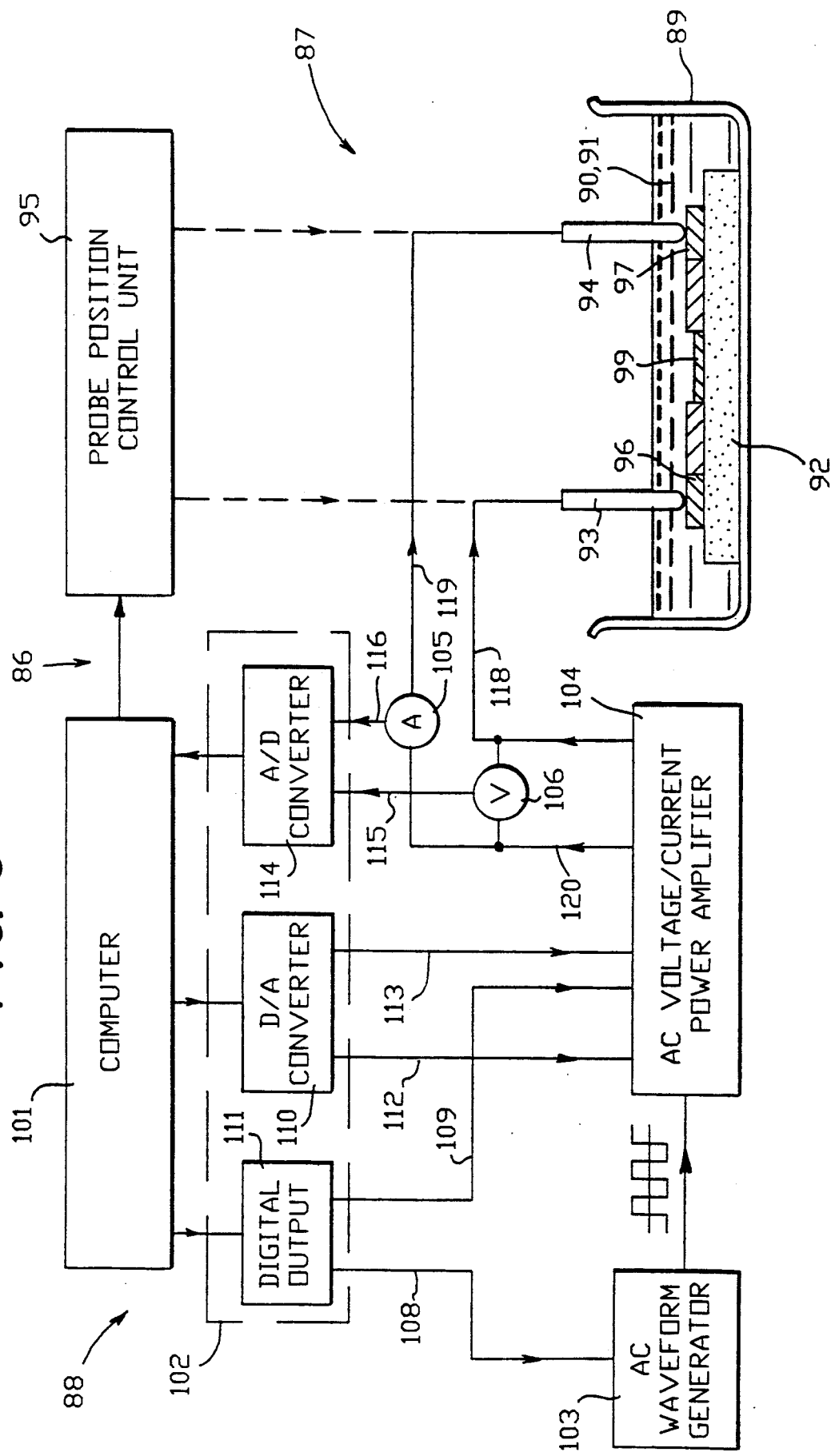
FIG. 8 is the preferred embodiment of the SIR apparatus.

Although all the steps may be executed on a single apparatus, it is much preferred to have a set of three stand-alone units: a seeding unit, a rinsing unit and a SIR unit to preform the entire process, as shown in FIGS. 7A, 7B and FIG. 8.

The seeding unit shown in FIGS. 7A and 7B, executes the spraying and laser direct writing. It consists of a table 66, a digitally controlled X-Y stage 67, a spray head 68, a focused laser 69 and focussing lens 70 to provide laser light 71. The valves of the spray head 68 and the shutter 72 of the laser light 71 are controlled by the controller 73 over leads 76 and 71', respectively. An alternative arrangement is to keep the substrate 74 stationary, then move the spray head 68 and the laser spot with X-Y stage 67. A liquid container 77 functions to hold and supply organometallic solution 78 to spray head 68. The x-y stage 67 is controlled by controller 73 over leads 80 and 81 for x and y positions, respectively.

At the first position shown in FIG. 7A, the X-Y stage 67 moves the substrate 74 to locate the desired spot under spray head 68. Then, controller 73 opens the valve of spray head 68, moves the substrate 74 back and forth along the path to be seeded, until the thickness of organometallic film 75 is adequate.

At the second position, FIG. 7B, the X-Y stage 67 moves the substrate 74 to locate one end of conductor line 75 starting the desired path under the laser spot. Controller 73 opens the shutter 72, and moves the substrate 74 to scan the laser spot along the desired path. Usually, one or two scans are enough. To repeat the scan on both ends of conductor line 75 is desirable, but not necessary. A cover 82 is provided for laser safety and chemical safety.

The rinsing unit may be a tray (not shown) or any apparatus which enables a solvent to rinse off the unreacted organometallic compound.

The self induced repair (SIR) unit 86 shown in FIG. 8 consists of a electrochemical cell 87, and an electronic controller 88. The container can be filled with a plating solution 90, or electrolyte 91, to cover the surface of substrate 92. A pair of probes 93,94, preferred to be automated by probe control unit 95. The probes may be made of copper or any metal covered with copper, are made to contact with the ends 96, 97 of line 99. The two probes 93 and 94 are connected to the two terminals of electronic controller 88.

Electronic controller 88 comprises a microcomputer 101 with a data acquisition board 102, which controls an ac waveform generator 103, and an electrically controlled constant voltage or constant current amplifier 104. An ac ammeter 105 and an ac voltmeter 106, measures the voltage and the current on line 99.

Acquisition board 102 couples a digital output signal indicative of frequency from digital output device 111 over lead 108 to an input of ac waveform generator 103. Acquisition board 102 couples a digital output signal indicative of amplifier mode (voltage or current) from digital output device 111 over lead 109 to an input of Ac voltage/current power amplifier.

Acquisition board 102 couples two analog voltage signals from D/A converter 110 over leads 112 and 113 respectively indicative of the desired magnitude voltage and magnitude current during the present time. Acquisition board 102 receives with A/D converter 114 two analog signals indicative of voltage and current over leads 115 and 116, respectively.

An output of ac voltage/current power amplifier is coupled over lead 118 to probe 93. A return path is coupled over lead 119 through ammeter 105 and lead 120 to Ac voltage/current power amplifier 104.

Figure 9A:
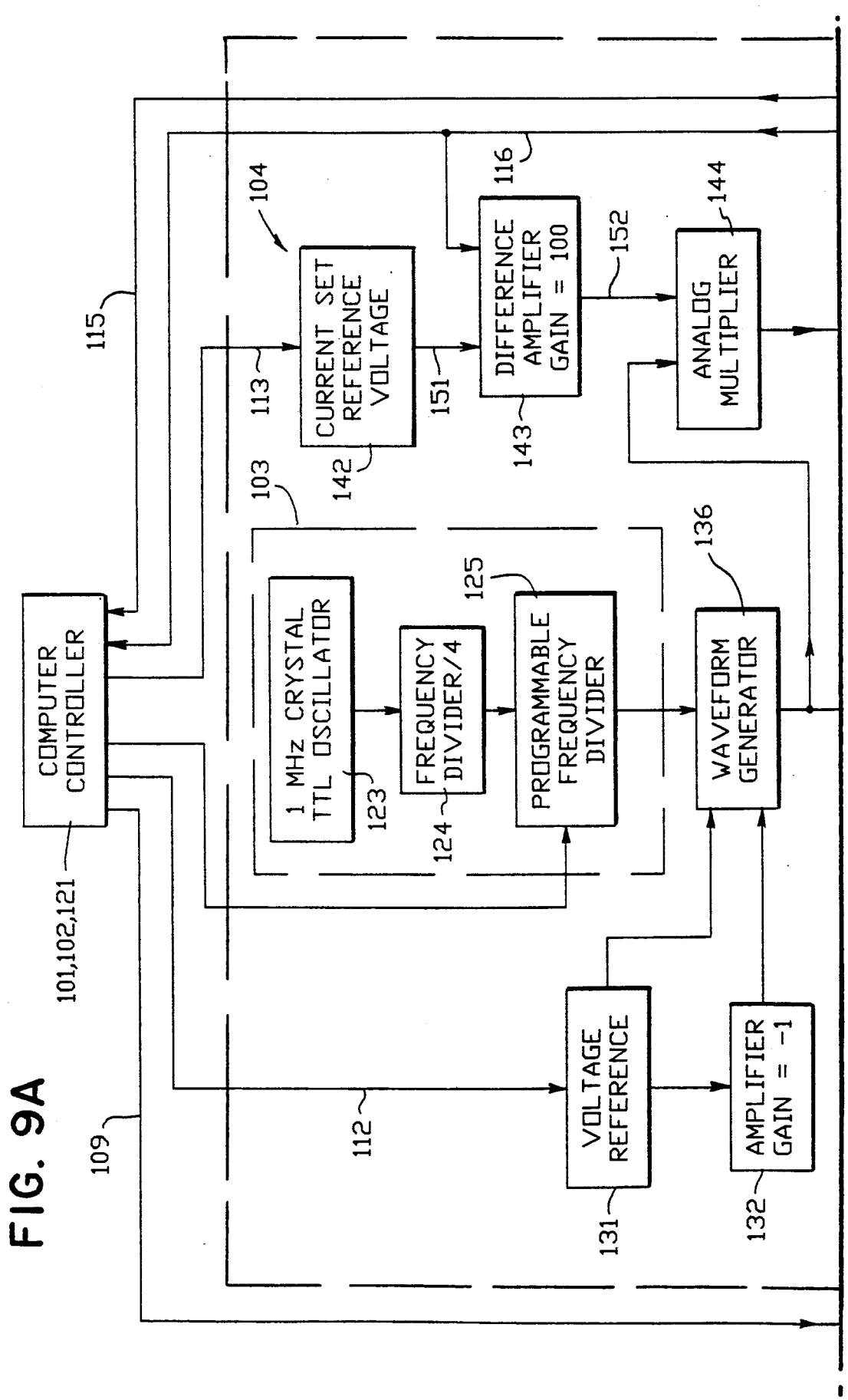

FIGS. 9A and 9B are a detailed block diagram of electronic controller 88 shown in FIG. 8. The defect 99 to be repaired is connected to the electronics via probes 93 and 94.

In FIGS. 9A and 9B like references are used for functions corresponding to the apparatus of FIG. 8. The crystal oscillator 123, divide by four frequency divider 124 and programmable frequency divider 125 provide a stable source of frequencies between 1 KHz and 64 KHz. The frequency can be set by either the computer controller 121 or by switches. The voltage reference 131 accepts a voltage provided over lead 112 by the controller 121 or can generate a voltage set locally that varies between 1 mV and 10 V. The unity gain inverting amplifier 132 takes the reference voltage and generates a negative voltage of the same magnitude. The waveform generator 136 creates a square wave whose peak amplitude is equal to the output of the voltage reference 131 and whose frequency is set by the output of the programmable frequency divider 125. The square wave has an average value of 0 Volts. The voltage/current mode select circuit 137 determines whether the self induced repair is occurring in a constant voltage or constant current regime by the signals on lead 109. In the constant voltage mode the output from the waveform generator 136 is applied to the power amplifier 138. The constant current mode will be addressed later in this document. The power amplifier 138 is a unity gain amplifier capable of a peak output voltage of 10 Volts and a peak output current of 2.5 Amps. The current detector 139 senses the current delivered to the defect, line 99, and has an output voltage proportional to the current. This signal is precision full wave rectified by the full wave rectifier 145 and filtered by lowpass filter 147 to provide a voltage proportional to the average current through the defect. This average current is displayed on a digital voltmeter 149 as well as being fed back over lead 116 to the computer controller 121 and difference amplifier 143. In a similar manner, the voltage across the defect is passed through a full wave rectifier 146 and lowpass filter 148 to obtain a voltage equal to the average value of the defect voltage. This signal is displayed on digital voltmeter 150 and fed back to the computer controller 121.

To operate in the constant current mode, a negative feedback loop is comprised by the current detector 139, full wave rectifier 145, lowpass filter 147, difference amplifier 143, analog multiplier 144 and voltage/current mode select 137 and power amplifier 138. The lowpass filter 147 provides the dominant pole of the system to assure stability. The average current is compared to a current set reference voltage 142 on lead 151 by difference amplifier 143. The current set reference voltage is normally controlled by the computer controller 121 over lead 113. The output of the difference amplifier 143 provides a control signal to analog multiplier 144 that scales the output of waveform generator 136 such that the desired current is obtained.

The control program requires that the computer, 101 of FIG. 8, which may be a personal computer to be equipped with a graphics monitor and a data acquisition board 102 which includes an A/D convertor 114, an D/A converter 110, and a digital output device 111. In addition to the control program, a parameter file is stored on the disk etc. The control program contains the following procedures: read parameters, adjust parameters, voltage ramp, current ramp, overdrive, and save data file.

Seven parameters are read from the parameters file: the frequency, the starting voltage, the voltage ramping rate, the crossover current or starting current, the current ramping rate, the maximum current, and the overdrive time. The values are displayed on the screen. A preferred arrangement of the display is shown in Table 1.

TABLE 1

| SET CONTROL PARAMETERS | | | |
|---|---|---|---|
| ITEM | UP | DOWN | VALUE |
| FREQUENCY | F1 | F2 | 32 kHz |
| STARTING V | F3 | F4 | 180 mV |
| V RAMP RATE | F5 | F6 | 4.0 mV/s |
| CROSSOVER I | F7 | F8 | 250 mA |
| I RAMP RATE | F9 | F10 | 10.0 mA/s |
| MAXIMUM I | ↑ | ↓ | 950 mA |
| OVERDRIVE T | → | ← | 60 sec |

A preferred embodiment for adjusting parameters is to use the function keys to increase or decrease the parameters. For example:

By pressing F1 (or F2) key, the frequency is doubled (or halved).

By pressing F3 (or F4) key, the starting voltage increases (or decreases) by a step (e.g., 10 mV).

By pressing F5 (or F6) key, the voltage ramping rate increases (or decreases) by a step (e.g., 0.1 mV/sec).

By pressing F7 (or F8) key, the crossover current increases (or decreases) by a step (e.g., 10 mA).

By pressing F9 (or F10) key, the current ramping rate increases (or decreases) by a step (e.g., 0.1 mA/sec).

By pressing arrow up (or arrow down) key, the maximum current increases (or decreases) by a step (e.g., 10 mA).

By pressing the right arrow (or left arrow) key, the overdrive time increases (or decreases) by a step (e.g., 10 sec).

After necessary adjustment, by pressing the <ENTER> key, the new parameters are stored in the parameter file (overwrites the previous ones).

The voltage ramping procedure may be programmed. For example, first set the amplifier to the voltage control mode.

Then set the voltage to the starting voltage through the D/A convertor and then count the number of seconds. At the end of each second, read the actual voltage and the current. If the current is equal to or larger than the cross over current, exit the loop and go to the current ramping procedure. If the current increment (i.e., the difference of the present current reading and the previous current reading) is larger than a preset value (e.g., 10 mA), then decrease the voltage by one step (i.e., the value of voltage ramping rate). Otherwise, increase the voltage by one step. Display the voltage, current, and the resistance (i.e., the ratio) on the graphics screen. Store the values of the voltage and the current in two arrays with the number of seconds as an index. Wait for the end of this second and loop. The current ramping procedure may be programmed. For example, first: set the amplifier to current control mode. Then, set the current the crossover current. Continue to count the number of seconds. At the end of each second, read the voltage and the actual current. If the current is equal to or larger than the maximum current, exit the loop and go to the constant current procedure. Otherwise, increase the current by one step (i.e., the value of the current ramping rate). Display the voltage, current, and the resistance (i.e., the ratio) on the graphics screen.

Store the values of the voltage and current in two arrays with the number of seconds as an index.

Wait for the end of this second and loop.

The constant current procedure may be programmed. For example, first: the amplifier stays in the current control mode and then, the current is set to the maximum current. Continue to count the number of seconds until the overdrive time is satisfied. At the end of each second, read the voltage and the actual current. Display the voltage, current, and the resistance (i.e., the ratio) on the graphics screen. Store the values of the voltage and the current in two arrays with the number of seconds as an index. At the end of the overdrive time, set the amplifier to the voltage control mode, set the voltage to zero, and signal the end of the process. If needed, the two data arrays (voltage and current) may be stored in a file with an assigned file name and a brief description.

After a SIR process is finished, the options are: readjust the parameters, start a new process, redisplay the stored data set, and or exit the program.

The functions of the probes 93 and 94 are, 1, providing electrical contact; and 2, as a source of copper.

The following are possible structures of the probes: solid copper probes, probes made of any metal plated with copper, and probes made of any metal, but electrically connected to a piece of copper located at any place in the plating solution.

There are seven operational parameters in the control program shown in Table 1 which are selected depending on the materials of the substrate and the chemical composition of the plating solution, as well as the width and thickness of the lines. These parameters may be determined by testing a number of samples of the same material and line dimensions.

The basic criterion for those parameters are: to obtain final interconnections of desired quality, such as thickness, width, metallurgical structure, conductance, and the results of a destructive test using a high current pulse; to avoid side effects, such as breaking of the seeded trace, bubble formation, and dendrite formation, and to minimize the processing time for maximum economic benefit.

Once a set of parameters are determined for a number of samples, these parameters can be used for the entire batch without major change.

The starting parameter voltage is selected dependent on the set up. For each sample, there is a maximum voltage with which no obvious resistance change is observed. This maximum voltage is the observed threshold voltage of the specific line. By testing a number of samples, the minimum of those observed threshold voltage is taken as the starting voltage. Theoretically, the absolute minimum threshold voltage is 60 mV. Typical values from observations are in the range from 120 to 180 mV.

The voltage ramp rate parameter is selected dependent on the set up.

To reduce the processing time, a high ramping rate is desirable. An excessively high ramping rate will cause the seeded trace to break or to cause side effects. An appropriate number can be determined by a number of experiments.

The critical current rise rate parameter is selected dependent on the set up. During the voltage ramp, the current is constantly measured and monitored. If the current rises too fast, the seeded trace may break or side effects may occur. A critical rate of the current rise is set in the program such that if the measured current rise exceeds the said critical rate, the voltage ramp is temporarily suspended or reversed. A typical number for the critical rate is 10 mA per second.

The crossover current parameter is selected dependent on the set up. As the voltage passes the threshold voltage, a dramatic decrease of resistance occurs. After that, the resistance of the line is almost identical to the resistance of the normal line. In other words, the resistance of the seeded section becomes an insignificant part of the total resistance. The appropriate value of such a crossover current can be determined experimentally. A typical value is 100 mA to 200 mA.

The current ramping rate parameter is selected dependent on the set up. The meaning of the current ramping rate was discussed in a previous patent (U.S. Pat. No. 4,919,971). Similar to the case of voltage ramping rate, it should be as high as possible to save process time, under the condition that no side effects occur. The typical value varies sharply with the dimensions of the line.

The maximum current and the overdrive time parameter is selected dependent on the set up. The criterion for determining these parameters is to guarantee the desired quality of the final result. A sufficiently long overdrive time at the maximum current will make the seeded section strong enough to pass the tests, e.g., the high-current test. Excessively large current and overdrive time will cause the line to expand too much, or cause dendrites. A few experimental tests are enough for their determination. Typical overdrive time is 1 to 2 minutes.

The total process time of the SIR step is usually less than five (5) minutes.

Figure 10:
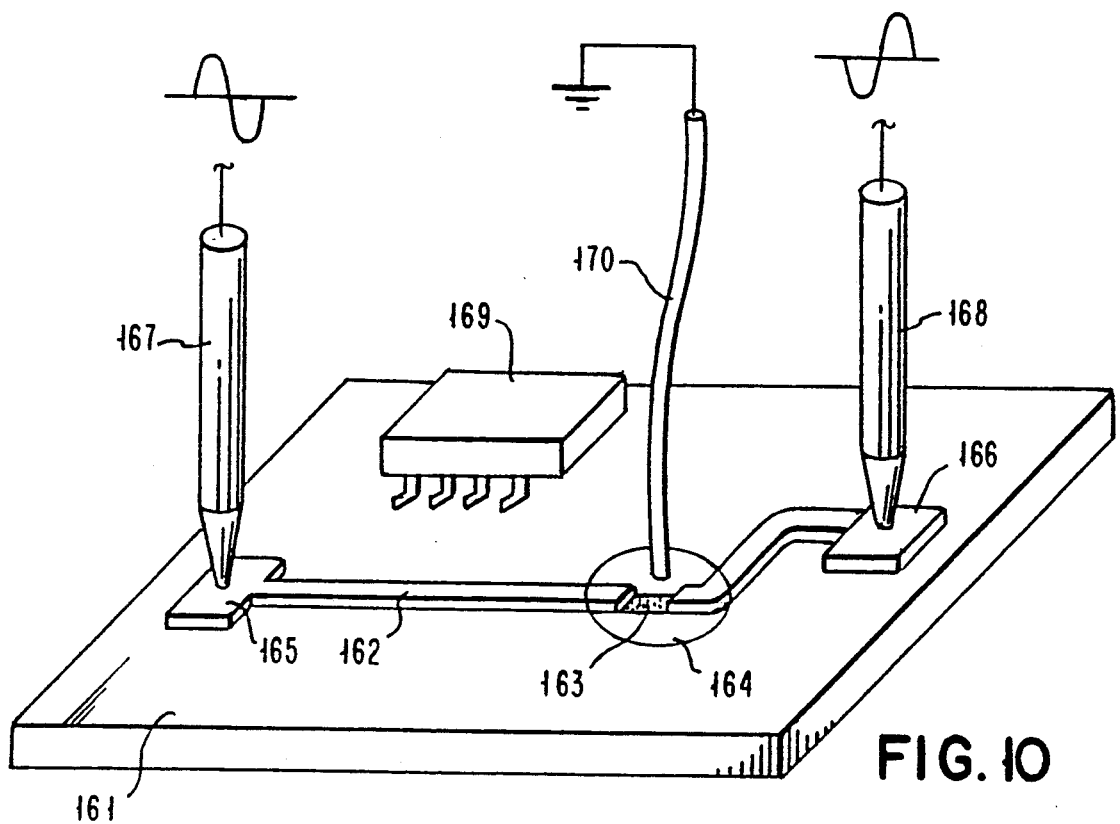
FIG. 10 shows the liquid-drop operation.

In some cases as shown in FIG. 10, it is not advantageous to immerse the entire board 161 into the liquid tray. For example, when board 161 is already fixed with components 169, which may be vulnerable to corrosion. In such cases, the plating solution or liquid drop 164 can be applied locally on board 161, covering the defect, seeded section 163, and its vicinity. To supply copper, a third electrode 170 (e.g., a piece of copper wire) is placed in contact with the liquid drop 164, which is electrically connected to the ground of the power supply supplying ac current to probes 167 and 168 in contact with ends 165 and 166 of conductor 162.

Figure 11:
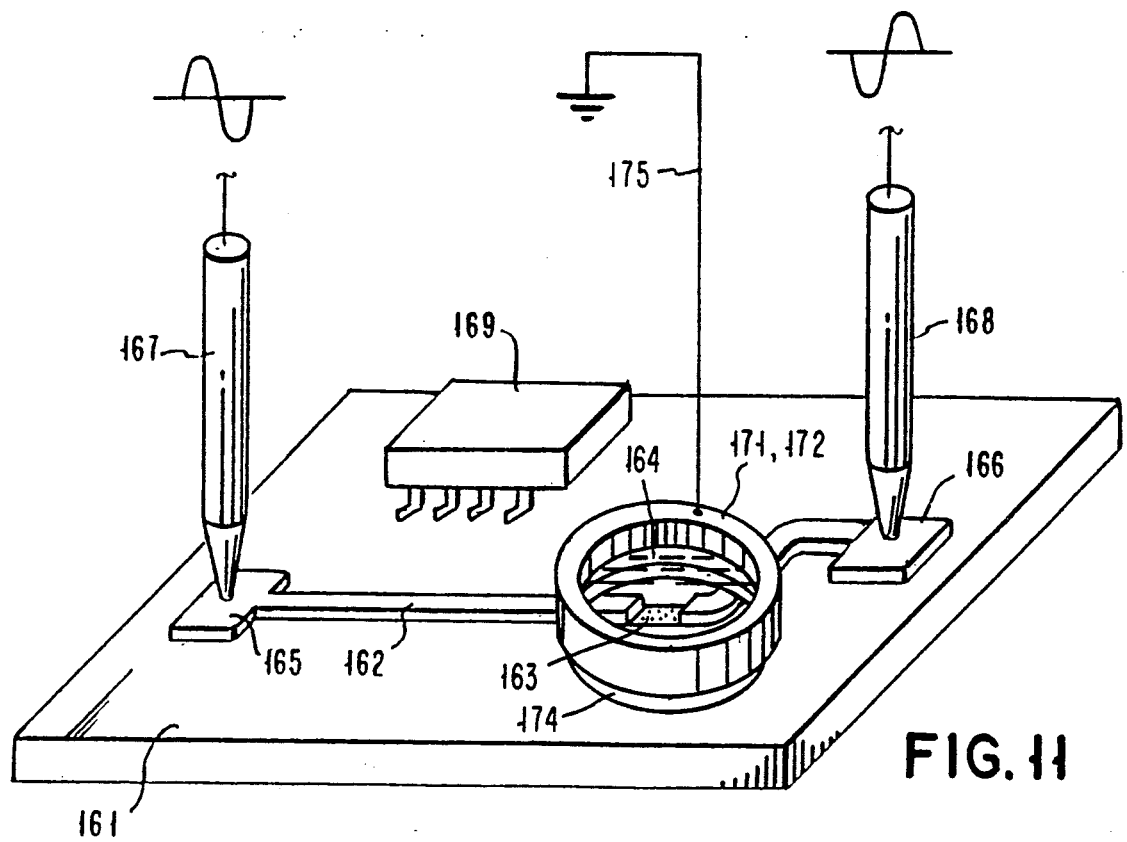
FIG. 11 shows the use of a liquid holder.

In the above cases in FIG. 10, to prevent the plating solution 164 from flowing to undesirable locations on board 161 and to keep the local application of plating solution 164 stable, a mechanical device 171 as shown in FIG. 11 is used to contain the plating solution 164. An example of device 171 is a copper ring with a circular groove on one end to fit with a rubber O-ring 174. The copper ring 172 is held onto the surface with a pressure to make it water tight. The copper ring 172, which is insulated from the board through the rubber O-ring 174, is connected to ground of the power supply over lead 175 to become the source of copper. In FIG. 11 like references are used for functions corresponding to the apparatus of FIG. 10.

Figure 12:
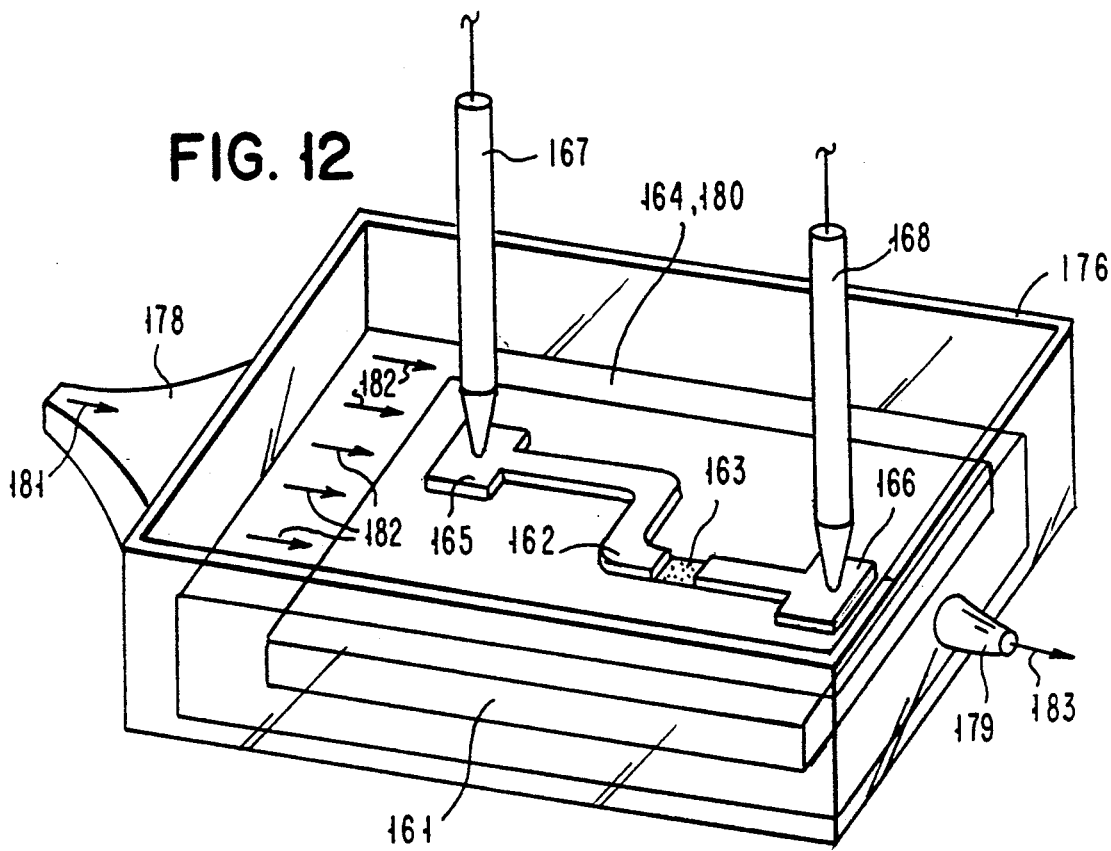
FIG. 12 shows the use of a flow-bed.

To eliminate bubbles and to avoid the formation of new bubbles, a flow bed operation is useful as shown in FIG. 12. The solution 164 is circulated by way of inlet 178 and outlet 179 either along or across the seeded section 163 being plated as shown by the arrows 181, 182 and 183 using a pump or gravity feed from a reservoir. In the case of using an electroless plating solution 180, to avoid local depletion of copper in the electrolyte 164, a flow-bed operation is preferred. In FIG. 12 like references are used for functions corresponding to the apparatus of FIGS. 10 and 11.

Another method to eliminate bubbles and to enhance stirring of the electrolyte is to insert an ultrasonic head into the plating solution 164. The ultrasonics effectively eliminates bubbles by ultrasonic agitation.

As an alternative to the spraying method, the organometallic film can be applied on the substrate by spinning, i.e., by applying an organometallic solution on the surface of the substrate and spreading the liquid by a spinning machine. If there are many interconnections to be made on one substrate, the spinning method is preferred. However, it may increase the use of the material (which is usually expensive) and requires the use of a spinning apparatus.

By enclosing the substrate in a vacuum system and filling it with an organometallic vapor, a conducting trace can be formed using a laser directly, without the application and subsequent rinsing step. This method can be executed using the existing system. However, the cost of the apparatus and material is much higher.

Instead of using a laser beam to scan the line or desired path, a projection system can be used for making the seeded trace, using either the solid-film process or the laser CVD process. The laser is focused through 1 suitable projection optics for a sufficient time to form the desired seed layer.

Yet another method for making a seeded trace is to use a fine-line printing device and conducting ink such as by silk screening to make the initial conducting trace for starting the SIR process.

Figure 13:
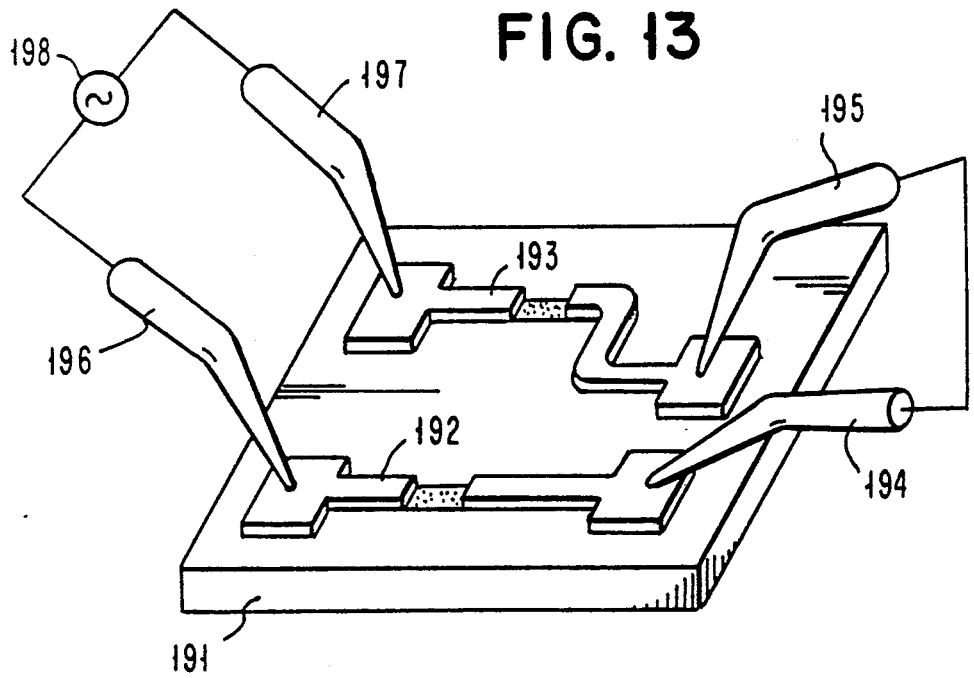
FIG. 13 shows the serial operation.

Experiments have demonstrated that if there are more than one defect in a line, the SIR process repairs all those defects at once. Therefore, by connecting several lines 192 and 193, in series, the SIR step can be executed in a single operation. This will reduce the process time, thus process cost. To realize it, a four probe system 194-197 (it is always possible to access four ends of two lines 192 and 193 with a four probe system) is applied as shown in FIG. 13. An alternative method is to use a bed-of-nails contact device. FIG. 13 also shows substrate 191 and ac power supply 198.

Instead of using a combined spraying-seeding station, the spraying and the seeding can be processed with separate machines. The spraying station can be made very inexpensive, because very low accuracy of the positioning system is required. The separation spraying from laser seeding can eliminate the possibility of contaminating the lens. Also, there is no need to make chemical protection changes to the laser seeding station if the spraying is made on an independent machine.

Within the audio frequency regime, the frequency of the ac power has little (if any) effect on the SIR process. In the preferred embodiment of the electronics, a very simple scheme is described: a binary series of frequencies: 1 kHz, 2 kHz, 4 kHz, . . . , 64 kHz, which can be easily obtained by frequency division. A continuous frequency variation will provide essentially the same result.

Because the nature of the ac power, including its waveform, the waveform selected is shown to be of little effect, in the preferred embodiment of electronics, the simplest case for electronics—the square wave, is described. Sine wave or any other waveform generates essentially the same result.

Figure 14A:
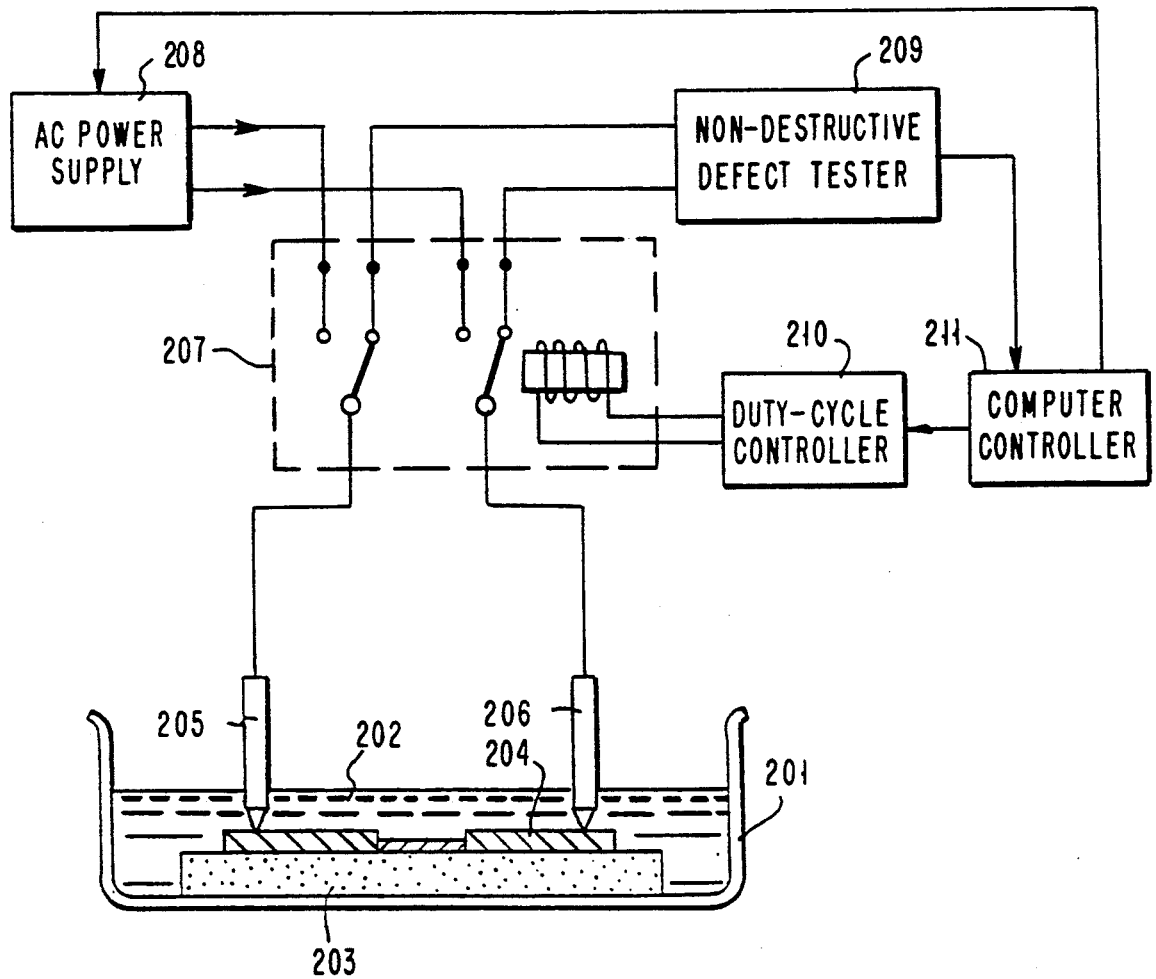
FIG. 14A shows the inclusion of a non-destructive tester.
Figure 14B:
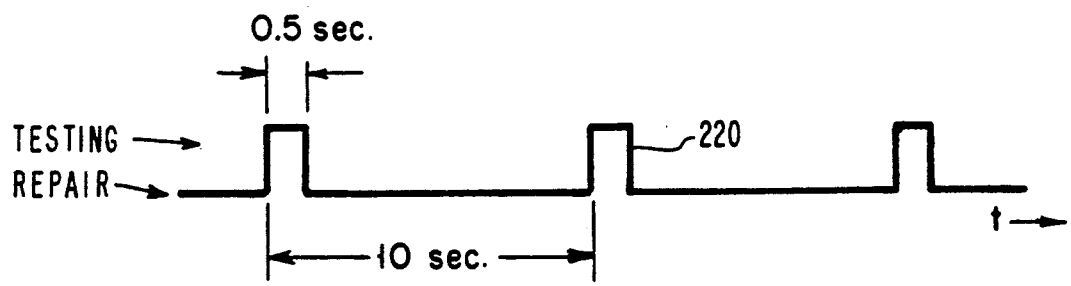
FIG. 14B shows a graph of the timing waveform for typical operation of the embodiment of FIG. 14A.

If any kind of non-destructive defect tester is available, for example, as described in U.S. Pat. Nos. 4,496,900, January, 1985 and 4,868,506, September, 1989, the periodic testing of the defect level has been helpful during plating. However, the apparatus of FIGS. 8 and 9 is proven to be completely functional without such defect tester. As shown in FIG. 14A, a software-based duty-cycle controller 210 and a relay 207 permits, the circuit 204 to be periodically switched off from the ac power 208, and temporarily connected to the defect tester 209. The reading of the defect tester 209 is sent to the computer controller 211, which can be displayed in real time. The frequency and duration for such testing should be limited to avoid wasting of processing time. For example, a possible scheme, as shown in FIG. 14B by waveform 220, is to interrupt the repair ac current every 10 seconds, to allow a 0.5 second time for non-destructive testing. This will only cause a 5% increase in processing time. Also shown in FIG. 14A are probes 205 and 206, tray 201, electrolyte 202 and substrate 203.

The SIR plating process is driven by the temperature difference between the defect and the rest of the copper line. One way to increase this temperature gradient is to use refrigerated electrolyte which may, or may not be circulated. This maintains the line at a low temperature and requires a higher repair current to maintain the maximum temperature at the defect. The overall effect is a greater temperature gradient and enhanced copper deposition (the copper plating interface remains at the high temperature and the copper quality is unaffected). The process is more localized and is faster.

The ac power can be modulated as bursts to further localize the Joule heating.

If the line is contacted by probes which are cooled or refrigerated, the temperature gradient enhancement referred to above can be achieved. The probes basically heat-sink the line and allow more power to be introduced to the defect and a more localized deposit results.

Alternatively, heat sinks could be applied to the line anywhere along its length on either side of the defect and power may, or may not, be applied through such heat sinks. Ideally, these should be copper or copper-plated to act as sacrificial anodes.

The overall effect would be reduced line dissolution, more localized copper deposition at the defect, and enhanced copper plating.

A third copper electrode can be placed in the electrolyte with an electrical connection with one of the probes to supply copper ions.

It has been found experimentally that power must be completely interrupted when the probes are not contacting the circuit pads. Any voltage difference between the electrodes causes plating and etching events at the probe tips which degrades their integrity. The ideal way to prevent any small, stray voltages from leaking from the SIR power source is to place them at the same electrical potential (i.e. short them together electrically). They could be grounded using a relay or simply shorted together. This connection is temporarily removed during the SIR repair process while the probes are contacting the circuit pads.

To aid in the release of gases formed on the copper line during SIR, as mentioned above a surfactant may be added to the plating bath. This needs to be sufficiently dilute that its presence does not significantly reduce the SIR plating efficiency.

An additional method for increasing the electrolyte flow during SIR is to impinge the solution locally at the site of the seed (or defect). This would mean pumping the solution from a nozzle so that it flowed over the segment being plated. This would increase the localization of the repair and avoid gas formation. The AC power input must be increased to compensate for the additional cooling effect. Such localized solution flow allows smaller electrolyte volumes to be used (and smaller pumps) than in the case of the flow-bed operation described above. The repair site, however, experiences essentially the same fluid flow (or better).

Instead of using a computer to control the SIR process, analog electronic circuitry could be incorporated in the electronics to control the ramp rate and the switchover between the constant current, constant voltage and overdrive regimes.

Instead of using a stand alone computer for controlling the SIR process, a single chip microprocessor-computer could be included in the SIR electronics. This would result in a lower cost albeit with some loss in flexibility.

Rather than implementing the constant current mode, a quasi-constant current mode could be implemented using a resistor in series with the defect. The value of the resistor should be at least 10 times greater than the defect resistance. Then the current is at least to a good approximation determined by the series resistor and voltage. This does tend to waste power but might be cheaper to implement. It also lends itself to parallel operation.

In the initial constant voltage mode, multiple defects may be driven by the same amplifier. During the constant current mode operation, this could be simulated by using a constant voltage mode with a large (compared to the defect) resistance in series with each defect. This would have the effect of greater system throughput with the same amount of control hardware.

We claim:

1. An apparatus for plating metal on a conductor in a first region having high electrical resistance positioned between second and third regions on said conductor having low electrical resistance comprising:

first means for introducing an electrolyte suitable for a subsequent metal plating process over and in electrical contact with said first, second and third regions, first and second probes, second means for positioning said first and second probes in electrical contact with said second and third regions, respectively, third means for applying alternating-current electrical power during a first time period through said first and second probes to said first region wherein the magnitude of the voltage across said first and second probes is controlled according to a predetermined function of time, and fourth means for applying alternating-current electrical power during a second time period after said first time period through said first and second probes to said first region wherein the magnitude of current passing through said first and second probes is controlled according to a predetermined function of time.

2. The apparatus of claim 1 wherein said third means includes fifth means for providing the waveform of said alternating-current electrical power selected from the group consisting of a sinusoidal wave, square wave, triangular wave, sawtooth wave, and any periodic waveform with a zero average direct-current component.

3. The apparatus of claim 1 wherein said third means includes fifth means for providing the frequency of the said alternating-current electrical power in the range from 50 Hz to 500 kHz.

4. The apparatus of claim 1 wherein said third means includes fifth means for measuring the magnitude of voltage of the said alternating-current electrical power is selected from the group consisting of the averaged absolute value, the peak value, or the root-mean-square value of the instantaneous voltage of said alternating-current electrical power over at least one complete cycle.

5. The apparatus of claim 1 wherein said fourth means includes fifth means for measuring the magnitude of current of the said alternating-current electrical power is selected from the group consisting of the averaged absolute value, the peak value, or the root-mean-square value of the instantaneous current of said alternating-current electrical power over at least one complete cycle.

6. The apparatus of claim 1 further including fifth means to limit the rising rate of the magnitude of current of the said applied alternating-current electrical power below a predetermined value during said first time period.

7. The apparatus of claim 1 wherein said first means includes fifth means for coating said first region with electrolyte having a thickness in the range from 1 to 10 mm.

8. The apparatus of claim 1 wherein said third means includes fifth means for increasing the magnitude of voltage of said alternating-current electrical power until the magnitude of current of said alternating-current electrical power reaches a first predetermined value.

9. The apparatus of claim 1 wherein said fourth means includes fifth means for increasing the magnitude of current of said alternating-current electrical power until the magnitude of current of the said alternating-current electrical power reaches a second predetermined value.

10. The apparatus of claim 9 wherein said fourth means includes sixth means for maintaining the magnitude of current of the said alternating-current electric power at said second predetermined value over a predetermined time after first reaching said second predetermined value.

11. An apparatus for repairing a partially defective conductor having an electrolyte liquid suitable for a subsequent metal plating process positioned thereover wherein said partially defective conductor includes a first region of reduced cross-section of high electrical resistance and second and third regions on either side of said first region of low electrical resistance comprising:
   first and second probes,
   first means for positioning said first and second probes in electrical contact with said second and third regions, respectively,
   second means for applying alternating-current electrical power during a first time period through said first and second probes to said first region wherein the magnitude of voltage across said first and second probes is controlled according to a predetermined function of time, and
   third means for applying alternating-current electrical power during a second time period after said first time period through said first and second probes to said first region wherein the magnitude of current passing through said first and second probes is controlled according to a predetermined function of time.

12. The apparatus of claim 11 further including fourth means to limit the rising rate of the magnitude of current of the applied alternating-current electrical power below a predetermined value during said first time period.

13. The apparatus of claim 11 wherein said second means includes fourth means for increasing the magnitude of voltage of said alternating-current electrical power until the magnitude of current of said alternating-current electrical power reaches a first predetermined value.

14. The apparatus of claim 11 wherein said third means includes fourth means for increasing the magnitude of current of said alternating-current electrical power until the said magnitude of current reaches a second predetermined value.

15. The apparatus of claim 14 wherein said fourth means includes fifth means for maintaining the magnitude of current of the said alternating-current electrical power over a predetermined time period at said second predetermined value after first reaching said second predetermined value.

16. An apparatus for repairing circuits having conductive wiring exposed to an ambient comprising:
   first means for locating a conductor having a defect in said exposed conductive wiring, said defect having an increased ohmic resistance compared to non-defective conductive wiring,
   seconds means for immersing said defect in an electrolyte, and
   third means for causing alternating current to pass through said conductor and said defect causing the temperature of said defect to rise compared to said conductor at non-defective regions whereby a cathodic reaction causes a metal to be electrolytically deposited on said defect,
   said third means further including fourth means for controlling the magnitude of voltage across said defect of an alternating-current electrical power during the first time period according to a predetermined function of time.

17. The apparatus of claim 16 wherein said fourth means for causing alternating current further includes fifth means for controlling said alternating current within a range to provide a corresponding range of temperature rise.

18. The apparatus of claim 16 wherein said electrolyte includes an electroless plating solution.

19. The apparatus of claim 16 wherein said third means further includes fifth means for controlling during a second time period after said first time period wherein the magnitude of current of said alternating-current electrical power is controlled according to a predetermined function of time.

20. The apparatus of claim 19 wherein said fifth means for controlling includes sixth means for maintaining the magnitude of current of said alternating-current electrical power over a predetermined time period through said defect.

21. A method for plating metal on a conductor in a first region having high electrical resistance positioned between second and third regions on said conductor having low electrical resistance comprising the steps of:
   introducing an electrolyte suitable for a subsequent metal plating process over and in electrical contact with said first, second and third regions,
   positioning first and second probes in electrical contact with said second and third regions, respectively,
   first applying alternating-current electrical power during a first time period through said first and second probes to said first region wherein the magnitude of the voltage across said first and second probes is controlled according to a predetermined function of time, and
   second applying alternating-current electrical power during a second time period after said first time period through said first and second probes to said first region wherein the magnitude of current passing through said first and second probes is controlled according to a predetermined function of time.

22. The method of claim 21, wherein said step of first applying includes providing the waveform of said alternating-current electrical power from the group consisting of a sinusoidal wave, square wave, triangular wave, sawtooth wave, and any periodic waveform with a zero average direct-current component.

23. The method of claim 21 wherein said step of first applying includes providing the frequency of the said alternating-current electrical power in the range from 50 Hz to 500 kHz.

24. The method of claim 21 wherein said step of first applying includes the step of measuring the magnitude of voltage of the said alternating-current electrical power selected from the group consisting of the averaged absolute value, the peak value, or the root-mean-square value of the instantaneous voltage of said alternating-current electrical power over at least one complete cycle.

25. The method of claim 21 wherein said step of second applying includes the step of measuring the magnitude of current of the said alternating-current electrical power selected from the group consisting of the averaged absolute value, the peak value, or the root-mean-square value of the instantaneous current of said alternating-current electrical power over at least one complete cycle.

26. The method of claim 21 further including the steps of limiting the rising rate of the magnitude of current of the said applied alternating-current electrical power below a predetermined value during said first time period.

27. The method of claim 21 wherein said step of introducing includes coating said first region with electrolyte having a thickness in the range from 1 to 10 mm.

28. The method of claim 21 wherein said step of first applying includes increasing the magnitude of voltage of said alternating-current electrical power until the magnitude of current of said alternating-current electrical power reaches a first predetermined value.

29. The method of claim 21 wherein said step of second applying includes increasing the magnitude of current of said alternating-current electrical power until the magnitude of current of the said alternating-current electrical power reaches a second predetermined value.

30. The method of claim 29 wherein said step of second applying includes maintaining the magnitude of current of the said alternating-current electric power at said second predetermined value over a predetermined time after first reaching said second predetermined value.

31. A method for repairing a partially defective conductor having an electrolyte liquid suitable for a subsequent metal plating process positioned thereover wherein said partially defective conductor includes a first region of reduced cross-section of high electrical resistance and second and third regions on either side of said first region of low electrical resistance comprising the steps of:
positioning first and second probes in electrical contact with said second and third regions, respectively,
first applying alternating-current electrical power during a first time period through said first and second probes to said first region wherein the magnitude of voltage across said first and second probes is controlled according to a predetermined function of time, and
second applying alternating-current electrical power during a second time period after said first time period through said first and second probes to said first region wherein the magnitude of current passing through said first and second probes is controlled according to a predetermined function of time.

32. The method of claim 31 further including the step of limiting the rising rate of the magnitude of current of the applied alternating-current electrical power below a predetermined value during said first time period.

33. The method of claim 31 wherein said step of first applying includes the step of increasing the magnitude of voltage of said alternating-current electrical power until the magnitude of current of said alternating-current electrical power reaches a first predetermined value.

34. The method of claim 31 wherein said step of second applying includes the step of increasing the magnitude of current of said alternating-current electrical power until the said magnitude of current reaches a second predetermined value.

35. The method of claim 34 wherein said step of increasing includes the step of maintaining the magnitude of current of the said alternating-current electrical power over a predetermined time period at said second predetermined value after first reaching said second predetermined value.

36. A method for repairing circuits having conductive wiring exposed to an ambient comprising the steps of:
locating a conductor having a defect in said exposed conductive wiring, said defect having an increased ohmic resistance compared to non-defective conductive wiring,
immersing said defect in an electrolyte, and
causing alternating current to pass through said conductor and said defect causing the temperature of said defect to rise compared to said conductor at non-defective regions whereby a cathodic reaction causes a metal to be electrolytically deposited on said defect, and
first controlling the magnitude of voltage across said defect of an alternating-current electrical power during a first time period according to a predetermined function of time.

37. The method of claim 36 wherein said step of controlling for includes second controlling said alternating current within a range to provide a corresponding range of temperature rise.

38. The method of claim 36 wherein said step of immersing includes the step of selecting an electroless plating solution.

39. The method of claim 36 wherein said step of second causing further includes the step of controlling during a second time period after said first time period wherein the magnitude of current of said alternating-current electrical power is controlled according to a predetermined function of time.

40. The method of claim 39 wherein said step of second controlling includes the step of maintaining the magnitude of current of said alternating-current electrical power over a predetermined time period through said defect.

* * * * *